(12) United States Patent
Okura et al.

(10) Patent No.: US 9,540,729 B1
(45) Date of Patent: Jan. 10, 2017

(54) DEPOSITION OF TITANIUM NANOLAMINATES FOR USE IN INTEGRATED CIRCUIT FABRICATION

(71) Applicant: ASM IP Holding B.V., Almere (NL)

(72) Inventors: Seiji Okura, Sagamihara (JP); Hidemi Suemori, Helsinki (FI); Viljami J. Pore, Helsinki (FI)

(73) Assignee: ASM IP HOLDING B.V., Amlere (NL)

( * ) Notice: Subject to any disclaimer, the term of this patent is extended or adjusted under 35 U.S.C. 154(b) by 0 days.

(21) Appl. No.: 14/835,456

(22) Filed: Aug. 25, 2015

(51) Int. Cl.
| | |
|---|---|
| *C23C 16/44* | (2006.01) |
| *C23C 16/455* | (2006.01) |
| *H01L 21/02* | (2006.01) |
| *H01L 21/311* | (2006.01) |
| *H01L 21/28* | (2006.01) |
| *H01L 49/02* | (2006.01) |
| *C23C 16/40* | (2006.01) |

(52) U.S. Cl.
CPC ......... *C23C 16/45529* (2013.01); *C23C 16/40* (2013.01); *C23C 16/45525* (2013.01); *C23C 16/45527* (2013.01); *C23C 16/45531* (2013.01); *C23C 16/45538* (2013.01); *H01L 21/022* (2013.01); *H01L 21/0228* (2013.01); *H01L 21/02172* (2013.01); *H01L 21/02186* (2013.01); *H01L 21/02205* (2013.01); *H01L 21/02274* (2013.01); *H01L 21/28194* (2013.01); *H01L 21/31111* (2013.01); *H01L 21/31122* (2013.01); *H01L 21/31144* (2013.01); *H01L 28/75* (2013.01)

(58) Field of Classification Search
None
See application file for complete search history.

(56) References Cited

U.S. PATENT DOCUMENTS

| | | |
|---|---|---|
| 5,625,217 A | 4/1997 | Chau et al. |
| 5,783,478 A | 7/1998 | Chau et al. |
| | (Continued) | |

FOREIGN PATENT DOCUMENTS

| | | |
|---|---|---|
| EP | 0854 505 | 7/1998 |
| WO | WO 94/14198 | 6/1994 |
| | (Continued) | |

OTHER PUBLICATIONS

V. Pore et al., Journal of Photochemistry and Photobiology A: Chemistry, vol. 177, year 2006, pp. 68-75.*

(Continued)

*Primary Examiner* — Jiong-Ping Lu
(74) *Attorney, Agent, or Firm* — Knobbe Martens Olson & Bear LLP

(57) ABSTRACT

Processes are provided for depositing titanium nanolaminate thin films that can be used, for example, in integrated circuit fabrication, such as in forming spacers in a pitch multiplication process. In some embodiments a titanium nanolaminate film comprising titanium oxide layers and titanium nitride layers is deposited on a three-dimensional feature, such as an existing mask feature. The conformal titanium nanolaminate film may be directionally etched so that only the titanium nanolaminate deposited or formed on the sidewalls of the existing three-dimensional feature remains. The three-dimensional feature is then removed via an etching process, leaving the pitch doubled titanium nanolaminate film.

25 Claims, 2 Drawing Sheets

(56) References Cited

U.S. PATENT DOCUMENTS

| | | | |
|---|---|---|---|
| 6,066,533 A | 5/2000 | Yu | |
| 6,166,417 A | 12/2000 | Bai et al. | |
| 6,225,168 B1 | 5/2001 | Gardner et al. | |
| 6,265,258 B1 | 7/2001 | Liang et al. | |
| 6,291,282 B1 | 9/2001 | Wilk et al. | |
| 6,335,240 B1 | 1/2002 | Kim et al. | |
| 6,368,954 B1 | 4/2002 | Lopatin et al. | |
| 6,373,111 B1 | 4/2002 | Zheng et al. | |
| 6,383,879 B1 | 5/2002 | Kizilyalli et al. | |
| 6,407,435 B1 | 6/2002 | Ma et al. | |
| 6,458,695 B1 | 10/2002 | Lin et al. | |
| 6,482,740 B2 | 11/2002 | Soininen et al. | |
| 6,506,676 B2 | 1/2003 | Park et al. | |
| 6,511,876 B2 | 1/2003 | Buchanan et al. | |
| 6,518,106 B2 | 2/2003 | Ngai et al. | |
| 6,534,395 B2 | 3/2003 | Werkhoven et al. | |
| 6,537,901 B2 | 3/2003 | Cha et al. | |
| 6,579,767 B2 | 6/2003 | Park et al. | |
| 6,596,576 B2 | 7/2003 | Fu et al. | |
| 6,613,695 B2 | 9/2003 | Pomarede et al. | |
| 6,627,503 B2 | 9/2003 | Ma et al. | |
| 6,660,660 B2 | 12/2003 | Haukka et al. | |
| 6,696,332 B2 | 2/2004 | Visokay et al. | |
| 6,700,771 B2 | 3/2004 | Bhattacharyya | |
| 6,703,708 B2 | 3/2004 | Werkhoven et al. | |
| 6,713,846 B1 | 3/2004 | Senzaki | |
| 6,714,435 B1 | 3/2004 | Dimmler et al. | |
| 6,717,226 B2 | 4/2004 | Hegde et al. | |
| 6,723,581 B1 | 4/2004 | Chabal et al. | |
| 6,730,163 B2 | 5/2004 | Vaartstra | |
| 6,730,588 B1 | 5/2004 | Schinella | |
| 6,806,145 B2 | 10/2004 | Haukka et al. | |
| 6,858,524 B2 | 2/2005 | Haukka et al. | |
| 7,045,406 B2 | 5/2006 | Huotari et al. | |
| 7,575,826 B2 | 8/2009 | Mantese et al. | |
| 8,945,675 B2 | 2/2015 | Pore et al. | |
| 2001/0041250 A1 | 11/2001 | Werkhoven et al. | |
| 2002/0008257 A1 | 1/2002 | Barnak et al. | |
| 2002/0030235 A1 | 3/2002 | Agarwal et al. | |
| 2002/0096724 A1 | 7/2002 | Liang et al. | |
| 2003/0049942 A1 | 3/2003 | Haukka et al. | |
| 2003/0072975 A1 | 4/2003 | Shero et al. | |
| 2003/0165615 A1 | 9/2003 | Aaltonen et al. | |
| 2004/0036129 A1 | 2/2004 | Forbes et al. | |
| 2005/0045092 A1 | 3/2005 | Wu et al. | |
| 2005/0073803 A1 | 4/2005 | Cho | |
| 2006/0163655 A1 | 7/2006 | Hoffman et al. | |
| 2006/0205143 A1 | 9/2006 | Govindarajan | |
| 2007/0006798 A1 | 1/2007 | Vaartstra et al. | |
| 2007/0093018 A1 | 4/2007 | Marsh | |
| 2009/0214927 A1 | 8/2009 | Dadheech et al. | |
| 2012/0064689 A1* | 3/2012 | Hirota | H01L 21/02178 438/381 |

FOREIGN PATENT DOCUMENTS

| | | |
|---|---|---|
| WO | WO 01/29893 | 4/2001 |
| WO | WO 01/66832 | 9/2001 |
| WO | WO 02/43115 | 5/2002 |
| WO | WO 02/50922 | 6/2002 |

OTHER PUBLICATIONS

G.T. Lim and D.H. Kim, Thin Solid Film, vol. 498, year 2006, pp. 254-258.*

Zhipeng et al., "In-Situ Nitrogen Doping of the TiO2 Photocatalyst Deposited by PEALD for Visible Light Activity", Plasma Science and Technology, vol. 16, No. 3, pp. 239-243, Mar. 2014.

Apetrei et al., "Photo-degradation activity of sputter-deposited nitrogen-doped titania thin films", Thin Solid Films, May 31, 2009, 15 pages.

Asahi et al., "Visible-Light Photocatalysis in Nitrogen-Doped Titanium Oxides", Science Magazine, vol. 293, Jul. 13, 2001, 3 pages.

Bai et al., "Monodisperse Nanoparticle Synthesis by an Atmospheric Pressure Plasma Process: An Axample of a Visible Light Photocatalyst", American Chemical Society, Jul. 21, 2004, 4 pages.

Batzill et al., "Influence of Nitrogen Doping on the Defect Formation and Surface Properties of $TiO_2$ Rutile and Anatase", Physical Review Letters, American Physical Society, Jan. 20, 2006, 4 Pages.

Beranek & Kisch., "Surface-modified anodic TiO2 films for visible light photocurrent response", Electrochemistry Communications, vol. 9, 2007, pp. 761-766.

Burda et al., "Enhanced Nitrogen Doping in $TiO_2$ Nanoparticles", Nano Letters, vol. 3(8), 2003, pp. 1049-1051.

Chang et al., "Photocatalytic performance of chromium or nitrogen doped arc ion plated-$TiO_2$ films", Surface & Coatings Technology, 2005, 5 pages.

Chappe et al., "Influence of substrate temperature on titanium oxynitride thin films prepared by reactive sputtering", Applied Surface Science, vol. 225, 2004, pp. 29-38.

Chen & Burda., "Photoelectron Spectroscopic Investigation of Nitrogen-Doped Titania Nanoparticles", Journal of Physical Chemistry, American Chemical Society, Aug. 26, 2004, pp. 15446-15449.

Chen et al., "Investigation of nitrogen doped $TiO_2$ photocatalytic films prepared by reactive magnetron sputtering" Catalysis Communications, vol. 5, 2004, pp. 677-680.

Cheng et al., "Visible Light Activity of Nitrogen-Doped $TiO_2$ Thin Films Grown by Atomic Layer Deposition", Electrochemical and Solid-State Letters, vol. 11(10), 2008, pp. D81-D84.

Cong et al., "Synthesis and Characterization of Nitrogen-Doped $TiO_2$ Nanophotocatalyst with High Visible Light Activity" J. Phys. Chem., vol. 111, 2007, pp. 6976-6982.

Diwald et al., "Photochemical Activity of Nitrogen-Doped Rutile $TiO_2$(110) in Visible Light", J. Phys. Chem. B, 108, 2004, pp. 6004-6008.

Diwald et al., "The Effect of Nitrogen Ion Implantation on the Photoactivity of $TiO_2$ Rutile Single Crystals", J. Phys. Chem. B, vol. 108, 2004, pp. 52-57.

Emeline et al., "Spectral Dependences of the Activity and Selectivity of N-doped $TiO_2$ in Photodegradation of Phenols", Journal of Photochemistry and Photobiology A: Chemistry, (2008), doi:10.1016/j.jphotochem.2009.01.001.

Gole et al., "Highly Efficient Formation of Visible Light Tunable $TiO_{2-x}N_x$ Photocatalysts and Their Transformation at the Nanoscale" J. Phys. Chem. B, 2003, 11 pages.

Guo et al., "Investigation of structure and properties of N-doped $TiO_2$ thin films grown by APCVD", Materials Science and Engineering B, vol. 135, 2006, pp. 83-87.

Ihara et al., "Visible-light-active titanium oxide photocatalyst realized by an oxygen-deficient structure and by nitrogen doping", Applied Catalysis B: Environmental 42 (2003), pp. 403-409.

Irie et al., "Nitrogen-Concentration Dependence on Photocatalytic Activity of $TiO_{2-x}N_x$ Powders", J. Phys. Chem. B, vol. 107, 2003, pp. 5483-5486.

Kobayakawa et al., "Visible-light active N-doped $TiO_2$ prepared by heating of titanium hydroxide and urea", Journal of Photochemistry and Photobiology A: Chemistry, vol. 170, 2005, pp. 177-179.

Kosowska et al., "The preparation of $TiO_2$-nitrogen doped by calcination of $TiO_2$—$_xH_2O$ under ammonia atmosphere for visible light photocatalysis" Solar Energy Materials & Solar Cells, vol. 88, 2005, pp. 269-280.

Kumar et al., "Photodegradation of ethylene using visible light responsive surfaces prepared from titania nanoparticle slurries", Applied Catalysis B: Environmental, vol. 57, 2005, pp. 93-107.

Kuroda et al., "Preparation of Visible-Light-Responsive $TiO_{2-x}N_x$ Photocatalyst by a Sol-Gel Method: Analysis of the Active Center on $TiO_2$ that Reacts with $NH_3$", Langmuir, vol. 21, 2005, pp. 8026-8034.

Lee et al., "Metalorganic chemical vapor deposition of $TiO_2$:N anatase thin film on Si substrate", American Institute of Physics, Feb. 13, 1995, 66(7).

Li et al., "Highly Active $TiO_2N$ Photocatalysts Prepared by Treating $TiO_2$ Precursors in $NH_3$/Ethanol Fluid under Supercritical Conditions", J. Phys. Chem. B, vol. 110, 2006, pp. 1559-1565.

(56) References Cited

OTHER PUBLICATIONS

Lindgren et al., "Photoelectrochemical and Optical Properties of Nitrogen Doped Titanium Dioxide Films Prepared by Reactive DC Magnetron Sputtering", J. Phys. Chem. B, vol. 107, 2003, pp. 5709-5716.
Liu et al., "Photocatalytic degradation of azo dyes by nitrogen-doped $TiO_2$ nanocatalysts" Chemosphere, vol. 61, 2005, pp. 11-18.
Matsumoto et al., "High visible-light photocatalytic activity of nitrogen-doped titania prepared from layered titania/isostearate nanocomposite" Catalysis Today, vol. 120, 2007, pp. 226-232.
Morikawa et al., "Band-Gap Narrowing of Titanium Dioxide by Nitrogen Doping" The Japan Journal of Applied Physics, vol. 40, 2001, pp. 561-563.
Mozia et al., "Decomposition of nonionic surfactant on a nitrogen-doped photocatalyst under visible-light irradiation", Applied Catalysis B: Environmental, vol. 55, 2005, pp. 195-200.
Mrowetz et al., "Oxidative Power of Nitrogen-Doped $TiO_2$ Photocatalysts under Visible Illumination" Journal of Physical Chemistry, American Chemical Society, Aug. 30, 2004, 5 pages.
Nakamura et al., "Mechanism for Visible Light Responses in Anodic Photocurrents at N-Doped $TiO_2$ Film Electrodes" J. Phys. Chem. B, vol. 108, 2004, pp. 10617-10620.
Pore et al., "Atomic layer deposition of $TiO_{2-x}N_x$ thin films for photocatalytic applications", Journal of Photochemistry and Photobiology A: Chemistry, vol. 177, 2006, pp. 68-75.
Pore, "Atomic Layer Deposition and Photocatalytic Properties of Titanium Dioxide Thin Films" University of Helsinki, Academic Dissertation, 2010, 89 pages.
Pradhan & Reucroft, "A study of growth and morphological features of $TiO_xN_y$ thin films prepared by MOCVD", Journal of Crystal Growth, vol. 250, 2003, pp. 588-594.
Sakthivel et al., "Visible Light Activity and Photoelectrochemical Properties of Nitrogen-Doped $TiO_2$", J. Phys. Chem. B, Sep. 29, 2004, 4 pages.
Suda et al., "Preparation of high quality nitrogen doped $TiO_2$ thin film as a photocatalyst using a pulsed laser deposition method", Thin Solid Films, 453 -454, 2004, pp. 162-166.
Suda et al., "Preparation of nitrogen-doped titanium oxide thin film using a PLD method as parameters of target material and nitrogen concentration ratio in nitrogen/oxygen gas mixture", Thin Solid Films, vol. 475, 2005, pp. 337-341.
Torres et al., "Photoelectrochemical Study of Nitrogen-Doped Titanium Dioxide for Water Oxidation" J. Phys. Chem. B, vol. 108, 2004, pp. 5995-6003.
Valentin et al., "Characterization of Paramagnetic Species in N-Doped $TiO_2$ Powders by EPR Spectroscopy and DFT Calculations" Journal of Physical Chemistry B Letters, vol. 109, May 21, 2005, pp. 11414-11419.
Valentin et al., "Origin of the different photoactivity of N-doped anatase and rutile $TiO_2$" Physical Review B 70, Aug. 30, 2004, 4 pages.
Vilhunen & Sillanpaa, "Atomic layer deposited (ALD) $TiO_2$ and $TiO_{2-x}-N_x$ thin film photocatalysts in salicylic acid decomposition", Water Science & Technology, 60.10, 2009, pp. 2471-2475.
Wan et al., "Improved optical response and photocatalysis for N-doped titanium oxide ($TiO_2$) films prepared by oxidation of TiN" Applied Surface Science, vol. 253, 2007, pp. 4764-4767.
Wong et al., "Reactively sputtered N-doped titanium oxide films as visible-light photocatalyst" Thin Solid Films, vol. 494, 2006, pp. 244-249.
Xu et al., "Studies on characteristics of nanostructure of N-$TiO_2$ thin films and photo-bactericidal action", Journal of Zhejiang University Science B, 2006, 7(7): pp. 586-590, Guangzhou, China.
Yang et al., "Effect of $N_2$ ion flux on the photocatalysis of nitrogen-doped titanium oxide films by electron-beam evaporation", Applied Surface Science, (252) Jul. 14, 2005, pp. 3729-3736.
Yang et al., "IR and XPS investigation of visible-light photocatalysis—Nitrogen-carbon-doped $TiO_2$ film", Applied Surface Science, vol. 253, 2006, pp. 1988-1994.
Yang et al., "Nitrogen-doped titanium oxide films as visible light photocatalyst by vapor deposition", Thin Solid Films, vol. 469-470, 2004, pp. 1-5.
Yates et al., "The role of nitrogen doping on the development of visible light-induced photocatalytic activity in thin $TiO2$ films grown on glass by chemical vapour deposition", Journal of Photochemistry and Photobiology A: Chemistry, vol. 179, 2006, pp. 213-223.
Yin et al., "Low temperature synthesis of $TiO_{2-x}N_y$ powders and films with visible light responsive photocatalytic activity", Solid State Communications, vol. 137, 2006, pp. 132-137.
Yin et al., "Preparation of nitrogen-doped titania with high visible light induced photocatalytic activity by mechanochemical reaction of titania and hexamethylenetetramine", Journal of Materials Chemistry, Oct. 17, 2003, vol. 13., pp. 2996-3001.
Yin et al., "Synthesis of excellent visible-light responsive $TiO_{2-x}N_y$ photocatalyst by a homogeneous precipitation-solvothermal process", Journal of Materials Chemistry, vol. 15, 2005, pp. 674-682.
1988RD-0296076, "Field Effect Transistor Structure with Improved Transconductance—Contg. Spacer-less Conducting Gate Oxide and Tungsten Deposition on Source and Drain," Anonymous.
Brezeanu, G. et al., High-K Dielectrics in Nano & Microelectronics, Nat'l Seminar of Nanoscience & Nanotechnology, September edition (2010).
Chatterjee et al., "CMOS Metal Replacement Gate Transistors using Tantalum Pentoxide Gate Insulator," IEEE, IEDM, 0-7803-4774-9/98, pp. 777-780 (1998).
Chen et al., "0.18 μm Metal Gate Fully-Depleted SOI MOSFETs for Advanced CMOS Applications," Symposium on VLSI Technology Digest of Technological Papers, pp. 25-26 (1999).
Diebold, Ulrike. The surface science of Titanium Dioxide, Surf Sci Rep, 48 (2003) pp. 53-229.
Ducroquet et al., "Full CMP Integration of CVD TiN Damascene Sub-0.1-μm Metal Gate Devices for ULSI Applications," IEEE Transactions on Electron Devices, vol. 48, No. 8, pp. 1816-1821 (2001).
Ferguson et al., "Titanium Nitride Metal Gate Electrode: Effect of Nitrogen Incorporation," Advanced Metallization Conference 2001 (AMC 2001), pp. 115-119.
Furubayashi et al., "Novel transparent conducting oxide: Anatase Ti1-xNbxO2", Thin Solid Films 496 (2006) 157-159.
Gillispie et al. "rf magnetron sputter deposition of transparent conducting Nb-doped $TiO2$ films on $SrTiO3$" Journal of Applied Physics 101, 033125 (2007).
H. Kim et al., Thin Solid Films vol. 517, year 2009, pp. 2563-2580.
Hitosugi et al. "Fabrication of highly conductive Ti1-xNbxO2 polycrystalline films on glass substrates via crystallization of amorphous phase grown by pulsed laser deposition" Applied Physics Letters 90,212106 (2007).
Hobbs et al., "Sub-Quarter Micron CMOS Process for TiN-Gate MOSFETs with $TiO_2$ Gate Dielectric formed by Titanium Oxidation," Advanced Products Research and Development Lab, Symposium on VLSi Technology Digest of Technical Papers, pp. 133-134 (1999).
Kafizas et al., "$TiO_2$-based transparent conducting oxides; the search for optimum electrical conductivity using a combinatorial approach," Journal of Materials Chemistry C, 2013, 1, 6335-6346.
Leskela et al. Atomic layer deposition (ALD): from precursor to thin film structures, Thin Solid Films 409 (2002) pp. 138-146.
Maiti et al., "PVD TiN Metal Gate MOSFETs on Bulk Silicon and Fully Depleted Silicon-On-Insulator (FDSOI) Substrates for Deep Sub-Quarter Micron CMOS Technology," IEEE, IEDM, 0-7803-4774-9/98, pp. 781-784 (1998).
Matero et al., "Effect of water dose on the automatic layer deposition of oxide thin films," Elsevier, *Thin Solid Films* 368 (2000) pp. 1-7.
Park et al., "Robust Ternary Metal Gate Electrodes for Dual Gate CMOS Devices," IEEE, IEDM, 0-7803-7050-3/02, pp. 671-674 (2001).
Polishchuk, "Dual Work Function Metal Gate CMOS Technology Using Metal Interdiffusion," IEEE Electron Device Letter, vol. 22, No. 9, pp. 444-446 (2001).

(56) References Cited

OTHER PUBLICATIONS

Robertson, J. Band Offsets of High Dielectric Constant Gate Oxides on Silicon, J. Non-Crystalline Solids 303 (2002) pp. 94-100.
Suntola, T. "Atomic Layer Epitaxy," *Handbook of Crystal Growth*, vol. 3, Chapter 14, NH 1994, pp. 605-663.
Wakabayashi et al., "A Novel W/TiNx Metal Gate CMOS Technology using Nitrogen-Concentration-Controlling TiNx Film," IEEE, IEDM, 0-7803-5410-9/99, pp. 253-256 (1999).
Yagishita et al., "High Performance Damascene Metal Gate MOSFET's for 0.1 μm Regime," IEEE Transactions on Electron Devices, vol. 47, No. 5, pp. 1028-1034 (2000).
Yagishita et al., Reduction of Threshold Voltage Deviation in Damascene Metal Gate MOSFET's, IEEE, IEDM, 0-7083-5410-9/99, pp. 257-260 (1999).
Yeo et al., "Dual-Metal Gate CMOS Technology with Ultrathin Silicon Nitride Gate Dielectric," IEEE Electronic Device Letters, vol. 22, No. 5, pp. 227-229 (2001).
Zhong et al., "Electrical Properties of $RuO_2$ Gate Electrodes for Dual Metal Gate Si-CMOS," IEEE Electron Device Letters, vol. 21, No. 12, Dec. 2000, pp. 593-595.

\* cited by examiner

DEPOSITION OF TITANIUM NANOLAMINATES FOR USE IN INTEGRATED CIRCUIT FABRICATION

BACKGROUND OF THE INVENTION

Field of the Invention

This invention relates generally to the field of semiconductor device fabrication and, more particularly, to the deposition of titanium nanolaminate films. The titanium nanolaminates can be used, for example, in processes for forming integrated circuits.

Description of the Related Art

There is an extremely high demand for integrated circuits to be decreased in size. This demand stems, for example, from a need for increased portability, increased computing power, increased memory capacity, and increased energy efficiency. In order to decrease the size of integrated circuits, the sizes of the constituent features, electrical devices and interconnect lines, for example, must be reduced as well.

The demand for reduced size has moved the industry to continuously reduce constituent feature size in integrated circuits. For example, transistors or memory circuits or devices such as dynamic random access memories (DRAMs), flash memory, static random access memories (SRAMs), ferroelectric (FE) memories, field effect transistors (FETs), such as multiple gate FETs, like FinFET's, are continuously being made smaller.

One example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute, for example, a memory cell and the sizes of the conducting lines that access the memory cells, the memory devices can be made smaller. Additionally, storage capacities can be increased by fitting more memory cells on a given area in the memory devices.

The continual reduction in feature size places ever greater demands on the techniques used to form the features. Photolithography, for example, is commonly used to pattern features, such as conductive lines. When dealing with photolithography, the concept of pitch can be used to describe the sizes of these features. Pitch is defined as the distance between an identical point in two neighboring features. These features are typically defined by the spaces between themselves, spaces that are typically filled by a material, such as an insulator. As a result, pitch can be viewed as the sum of the width of a feature and of the width of the space on one side of the feature separating that feature from a neighboring feature. However, due to factors such as the optics, or the wavelength of light used in the technique, photolithographic techniques each have a minimum pitch below which a particular photolithographic technique cannot reliably form features. Thus, the minimum pitch of a photolithographic technique is an obstacle to continued feature size reduction.

Pitch doubling, pitch multiplication, or spacer defined double/quadruple patterning is a method for extending the capabilities of photolithographic techniques beyond their minimum pitch. During a pitch doubling process a spacer film layer is formed or deposited over an existing mask feature. The spacer film is then etched, preferably using a directional etch, such as a reactive ion etch, thereby leaving only the spacer, or the material extending or formed from the sidewalls of the original mask feature. Upon removal of the original mask feature, only the spacer remains on the substrate. Thus, where a given pitch previously included a pattern defining one feature and one space, the same width now includes two features and two spaces, with the spaces defined by, in this instance, the spacers. As a result, the smallest feature size possible with a photolithographic technique is effectively decreased. While the pitch is actually halved in the above example, this reduction in pitch is referred to as pitch "doubling," because the linear density of features has been doubled. The process as described above can be performed additional times, using the newly formed spacers as the original mask feature to again reduce the pitch by half, or quadruple the linear density of features.

In spacer applications, such as in the pitch multiplication process as described above, materials with specific etch characteristics are required for device fabrication. The original mask feature in a pitch multiplication process is typically thermal silicon dioxide ($SiO_2$), with hydrofluoric acid used to etch, or remove, the mask feature. It is preferable that the thermal $SiO_2$ mask feature is etched away completely while the spacer material remains intact. Therefore, spacer film materials with lower etch rates than that of thermal $SiO_2$, for example in hydrofluoric acid, are needed.

Additionally, because spacers are formed on the sidewalls of pre-patterned features, spacer films are preferably conformal. In order to achieve this conformality, deposition techniques such as atomic layer deposition (ALD) or plasma enhanced atomic layer deposition (PEALD) are typically used. The template materials used in pitch multiplication processes can also lower the allowed thermal budget, thereby favoring lower temperature deposition techniques such as PEALD.

Titanium dioxide ($TiO_2$) is a material which has favorable etch selectivity compared to thermal $SiO_2$, and can be conformally grown by PEALD at relatively low temperatures. Tetrakis(dimethylamido)titanium (TDMAT) or other alkylamides are typically used as titanium precursors, while $O_2$ plasma is typically used as an oxygen precursor. $TiO_2$, however, crystalizes easily, for example because of extra energy like plasma or temperature, causing roughness in the spacer film which renders the resulting spacer unacceptable for its intended use. Although smooth, amorphous, $TiO_2$ possibly could be grown as a thin film up to 20 nm thick in some cases, the growth of thicker $TiO_2$ films or the use of extra energy leads to crystallization.

Accordingly, there is a need for methods of forming or depositing conformal thin films that are smooth and amorphous, while retaining favorable etch selectivity.

SUMMARY OF THE INVENTION

According to some aspects of the present invention, processes are provided for depositing titanium nanolaminate thin films. The titanium nanolaminate films may be used, for example, in integrated circuit fabrication. The process may comprise depositing a first titanium material layer comprising nitrogen, oxygen, and/or carbon by at least one cycle of a first deposition process, depositing a second titanium oxide layer by at least one cycle of a second deposition process, and repeating at least the depositing a first titanium material layer step until a titanium nanolaminate thin film of a desired thickness has been formed. In some embodiments the first titanium material comprises at least one of titanium oxynitride, titanium oxycarbide, titanium nitride, and titanium carbide.

In some embodiments the process may be used to form spacers in an integrated circuit fabrication process. In some embodiments the first titanium material layer may comprise titanium nitride and the second titanium oxide layer may comprise titanium oxide. In some embodiments a number of cycles of the first titanium material deposition process may be more than about 2 times a number of cycles of the second titanium oxide deposition process. In some embodiments a cycle of the second titanium oxide deposition process may be carried out for between about every 1 cycle to about every 100 cycles of the first titanium material deposition process. In some embodiments a ratio of a number of first titanium material layers to a number of second titanium oxide layers in the titanium nanolaminate thin film may be from about 1:1 to about 100:1. In some embodiments a ratio of a number of first titanium material layers to a number of second titanium oxide layers in the titanium nanolaminate thin film may be from about 1:1 to about 50:1. In some embodiments a ratio of a number of first titanium material layers to a number of second titanium oxide layers in the titanium nanolaminate thin film may be from about 1:1 to about 30:1.

In some embodiments the first cyclical deposition process may comprise at least one cycle, the cycle comprising contacting the substrate with a first vapor phase titanium precursor, removing excess first vapor phase titanium precursor and reaction by-products, if any, contacting the substrate with a first vapor phase reactant, removing excess first vapor phase reactant and reaction by-products, if any, and repeating the contacting and removing steps until a first titanium material layer comprising nitrogen, oxygen, and/or carbon of a desired thickness is formed. In some embodiments the first cyclical deposition process may be an atomic layer deposition (ALD) process. In some embodiments the first cyclical deposition process may be a plasma enhanced atomic layer deposition (PEALD) process. In some embodiments the first vapor phase titanium precursor may comprise an alkylamine ligand. In some embodiments the first vapor phase titanium precursor may comprise at least one of titanium tetraisopropoxide (TTiP), tetrakis(dimethylamino) titanium (TDMAT), tetrakis(diethylamino)titanium (TDEAT), and tetrakis(ethylmetylamino)titanium (TEMAT). In some embodiments the first vapor phase reactant may comprise at least one of nitrogen, oxygen, and hydrogen. In some embodiments the first vapor phase reactant may comprise at least one of $NH_3$, $N_2H_2$, nitrogen plasma, nitrogen radicals, nitrogen atoms, $O_2$, $O_3$, $H_2O$, oxygen plasma, oxygen radicals, oxygen atoms, $H_2$, hydrogen plasma, hydrogen radicals, and hydrogen atoms.

In some embodiments the second cyclical deposition process may comprise at least one cycle, the cycle comprising contacting the substrate with a second vapor phase titanium precursor, removing excess second vapor phase titanium precursor and reaction by-products, if any, contacting the substrate with a second vapor phase reactant comprising oxygen, removing excess second vapor phase reactant and reaction by-products, if any, and repeating the contacting and removing steps until a second titanium oxide layer of a desired thickness is formed. In some embodiments the second cyclical deposition process may be an atomic layer deposition (ALD) process. In some embodiments the second cyclical deposition process may be a plasma enhanced atomic layer deposition (PEALD) process. In some embodiments the second vapor phase titanium precursor may comprise an alkylamine ligand. In some embodiments the second vapor phase titanium precursor may comprise at least one of titanium tetraisopropoxide (TTiP), tetrakis(dimethylamino)titanium (TDMAT), tetrakis(diethylamino)titanium (TDEAT), and tetrakis(ethylmetylamino)titanium (TEMAT). In some embodiments the first vapor phase titanium precursor and the second vapor phase titanium precursor may be the same. In some embodiments the second vapor phase reactant may comprise oxygen. In some embodiments the second vapor phase reactant may comprise at least one of $O_2$, $O_3$, $H_2O$, oxygen plasma, oxygen radicals, oxygen atoms.

In some embodiments a ratio of a dry etch rate of the titanium nanolaminate thin film to a dry etch rate of silicon dioxide may be about 1:3. In some embodiments a ratio of a dry etch rate of the titanium nanolaminate thin film to a dry etch rate of silicon dioxide may be about 1:5. In some embodiments a ratio of a dry etch rate of the titanium nanolaminate thin film to a dry etch rate of silicon dioxide may be about 1:10. In some embodiments a ratio of a wet etch rate of the titanium nanolaminate thin film to a wet etch rate of silicon dioxide may be about 1:3. In some embodiments a ratio of a wet etch rate of the titanium nanolaminate thin film to a wet etch rate of silicon dioxide may be about 1:5. In some embodiments a ratio of a wet etch rate of the titanium nanolaminate thin film to a wet etch rate of silicon dioxide may be about 1:10. In some embodiments the titanium nanolaminate may have a surface roughness, Rq, less than about 0.2 microns.

According to some aspects of the present invention, processes are provided for depositing titanium nanolaminate thin films on a substrate in a reaction chamber by atomic layer deposition (ALD). The process comprises at least one supercycle, the supercycle comprising a first titanium material deposition process comprising at least one cycle, the cycle comprising alternately and sequentially contacting the substrate with a first vapor phase titanium precursor and a first reactant. The supercycle may further comprise a second titanium oxide layer deposition process comprising at least one cycle, the cycle comprising alternately and sequentially contacting the substrate with a second vapor phase titanium precursor and a second reactant comprising oxygen. The supercycle may further comprise repeating the first titanium material deposition process and the second titanium oxide deposition process until a titanium nanolaminate thin film of a desired thickness is formed. In some embodiments the process may be used to form spacers for use in integrated circuit fabrication. In some embodiments the first vapor phase titanium precursor and the second vapor phase titanium precursor may comprise at least one of titanium tetraisopropoxide (TTiP), tetrakis(dimethylamino)titanium (TDMAT), tetrakis(diethylamino)titanium (TDEAT), and tetrakis(ethylmetylamino)titanium (TEMAT). In some embodiments the first reactant may comprise at least one of $NH_3$, $N_2H_2$, nitrogen plasma, nitrogen radicals, nitrogen atoms, $O_2$, $O_3$, $H_2O$, oxygen plasma, oxygen radicals, oxygen atoms, $H_2$, hydrogen plasma, hydrogen radicals, and hydrogen atoms. In some embodiments the second reactant may comprise at least one of $O_2$, $O_3$, $H_2O$, oxygen plasma, oxygen radicals, oxygen atoms. In some embodiments a number of first titanium material deposition cycles may be more than about 2 times number of second titanium oxide deposition cycles.

According to some aspects of the present invention, processes are provided for forming titanium nanolaminate spacers. The process comprises conformally depositing a titanium nanolaminate thin film via PEALD over an existing mask feature on a substrate in a reaction space, preferentially etching the titanium nanolaminate thin film from horizontal surfaces of the substrate and mask feature, preferentially etching the mask feature, wherein titanium nanolaminate deposited on or extending from a vertical surface of the mask feature remains relatively unetched. In some embodiments the spacers may be used in a pitch multiplication process. In some embodiments preferentially etching the titanium nanolaminate film from horizontal surfaces may comprise a reactive ion etch. In some embodiments preferentially etching the mask feature may comprise a hydrofluoric acid wet etch. In some embodiments the substrate may comprise silicon. In some embodiments mask feature may comprise $SiO_2$.

DETAILED DESCRIPTION OF THE PREFERRED EMBODIMENT

Figure 1:
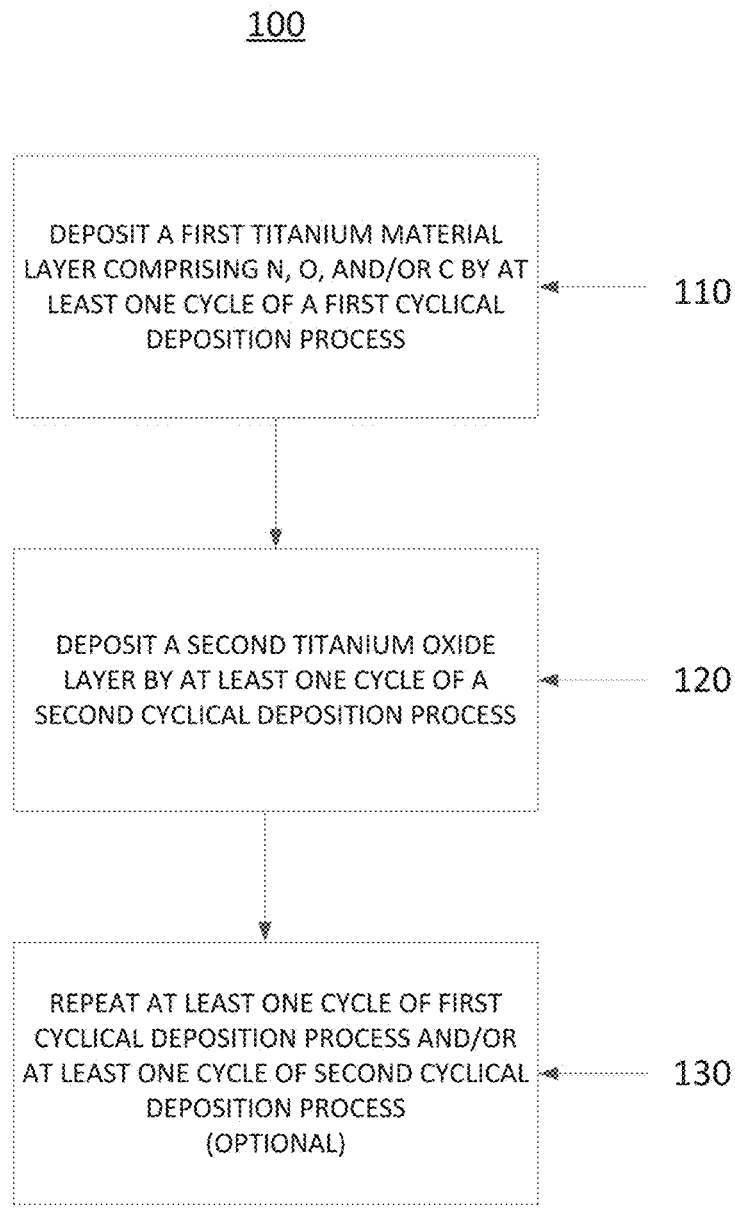
FIG. 1 is a flow chart illustrating a process for depositing a titanium nanolaminate thin film according to some embodiments of the present disclosure.

Crystallization in titanium oxide thin films can be suppressed by adding foreign atoms to the material. In some embodiments, a titanium nanolaminate thin film is formed by depositing a first titanium material comprising another element such as oxygen, carbon and/or nitrogen and a second titanium oxide. The titanium nanolaminate may comprise a first layer comprising titanium and one or more of nitrogen, oxygen and carbon and at least one titanium oxide layer. In some embodiments the first layer is a titanium nitride layer. Thus, in some embodiments, a titanium nanolaminate comprises at least two alternating layers of titanium nitride and titanium oxide. In some embodiments the first layer is a titanium oxynitride ($TiO_xN_y$) layer. The $TiO_xN_y$ layer may comprise carbon in some embodiments. In some embodiments a titanium nanolaminate comprises at least two alternating layers of titanium oxynitride and titanium oxide. In some embodiments the second layer is a titanium oxycarbide layer. In some embodiments a titanium nanolaminate comprises at least two alternating layers of titanium oxycarbide and titanium oxide. In some embodiments the second layer is titanium carbide layer. In some embodiments a titanium nanolaminate comprises at least two alternating layers of titanium carbide and titanium oxide.

In some embodiments one or both of the first titanium layer and the second titanium oxide layer are deposited by an atomic layer deposition process.

As discussed in more detail below, in some embodiments one or more titanium oxide layers in a titanium nanolaminate are deposited by an ALD process comprising alternately and sequentially contacting a substrate in a reaction space with a titanium precursor and an oxygen precursor.

In some embodiments, one or more titanium nitride layers in a titanium nanolaminate are deposited by an ALD process comprising alternately and sequentially contacting a substrate in a reaction space with a titanium precursor and a nitrogen precursor.

In some embodiments, one or more titanium oxynitride ($TiO_xN_y$) layers in a titanium nanolaminate may be deposited by an ALD process comprising alternately and sequentially contacting a substrate in a reaction space with a first titanium precursor and a second precursor comprising nitrogen and oxygen. For example, in some embodiments nitrogen and oxygen atoms are present in a plasma reactant, thereby depositing titanium oxynitride.

In some embodiments, one or more titanium oxycarbide ($TiO_xC_y$) layers in a titanium nanolaminate may be deposited by alternately and sequentially contacting a substrate in a reaction space with a first titanium precursor comprising carbon and a second precursor comprising oxygen. For example, in some embodiments oxygen atoms are present in a plasma that is used as the second precursor.

In some embodiments, one or more titanium carbide (TiC) layers in a titanium nanolaminate may be deposited by alternately and sequentially contacting a substrate in a reaction space with a first titanium precursor comprising carbon and a second reactant.

In some common integrated circuit fabrication processes, for example pitch multiplication processes, the spacers and original mask feature are simultaneously exposed to an etchant, typically hydrofluoric acid, which preferentially etches the original mask feature. As titanium dioxide has etch selectivity towards silicon dioxide, an $SiO_2$ mask feature can be preferentially etched while spacers of titanium nanolaminate that have been conformally deposited on the side walls of the mask feature can remain relatively unetched. Therefore, etch selectivity relative to $SiO_2$ is an important characteristic of any material comprising a spacer. Although foreign atoms can be introduced into the spacer material, it is important that these foreign atoms not significantly impair the etch selectivity of the spacer material. Additionally, the titanium nanolaminate films deposited according to the processes described herein may be useful as sacrificial layers in, for example, patterning applications.

Nanolaminates

The composition of a titanium film can be controlled by depositing a titanium nanolaminate comprising at least two layers of a first titanium material comprising nitrogen, oxygen and/or carbon and at least one layer of a titanium oxide. The first titanium material may be titanium nitride, titanium oxycarbide, titanium oxynitride or titanium carbide. In some embodiments, one or more layers of the first titanium material and the titanium oxide are alternated. The ratio of first titanium material layers to layers of the titanium oxide may be, for example, from about 1:1 to about 100:1, preferably from about 1:1 to about 50:1, more preferably from about 1:1 to about 30:1, more preferably about 19:1.

In some embodiments, each layer of the first titanium material is deposited by one or more cycles of a first ALD process, and each layer of the titanium oxide is deposited by one or more cycles of a second ALD process. The ratio of first titanium material deposition cycles to deposition cycles of the titanium oxide may be, for example, from about 1:1 to about 100:1, preferably from about 1:1 to about 50:1, more preferably from about 1:1 to about 30:1, more preferably about 19:1. The titanium reactant in the first and second ALD process may use the same titanium precursor. In some embodiments a different titanium precursor is used in each process.

In some embodiments, a titanium nitride deposition cycle and a titanium oxide deposition cycle are used to deposit alternating layers of TiN and titanium oxide. The stoichiometry of the resulting film can be precisely controlled by varying the ratio of the titanium nitride deposition cycles and a titanium oxide deposition cycles. In some embodiments the ratio of titanium nitride deposition cycles to deposition cycles of titanium oxide may be, for example, from about 1:1 to about 100:1, preferably from about 1:1 to about 50:1, more preferably from about 1:1 to about 30:1, more preferably about 19:1. The thickness of each deposited layer and the overall nanolaminate can be controlled by selecting the total number of cycles for each material.

In some embodiments, a titanium oxynitride deposition cycle and a titanium oxide deposition cycle are used to deposit alternating layers of $TiO_xN_y$ and titanium oxide. The stoichiometry of the resulting film can be precisely controlled by varying the ratio of the titanium oxynitride deposition cycles and titanium oxide deposition cycles. The thickness of each deposited layer and the overall thickness of the nanolaminate can be controlled by selecting the total number of cycles for each material.

In some embodiments, a titanium oxycarbide deposition cycle and a titanium oxide deposition cycle are used to deposit alternating layers of $TiO_xC_y$ and titanium oxide. The stoichiometry of the resulting film can be precisely controlled by varying the ratio of the titanium oxycarbide deposition cycles and titanium oxide deposition cycles. The thickness of each deposited layer and the overall thickness of the nanolaminate can be controlled by selecting the total number of cycles for each material.

In some embodiments, a titanium carbide deposition cycle and a titanium oxide deposition cycle are used to deposit alternating layers of titanium carbide and titanium oxide. The stoichiometry of the resulting film can be precisely controlled by varying the ratio of the titanium carbide deposition cycles and titanium oxide deposition cycles. The thickness of each deposited layer and the overall thickness of the nanolaminate can be controlled by selecting the total number of cycles for each material.

In some embodiments alternating monolayers of a first titanium material film and a titanium oxide film are deposited. For example, at least one ALD cycle for depositing a first titanium material is carried out, followed by one ALD cycle for forming the titanium oxide film. The ALD cycles are alternately carried out until a nanolaminate of a desired thickness has been formed. In this way a titanium nanolaminate can be formed comprising alternating layers of a first titanium material and the titanium oxide.

The ratio of cycles for depositing the first titanium material film and the titanium oxide film can be controlled to achieve a desired composition in the nanolaminate. For example, in some embodiments, multiple ALD cycles can be used to deposit a first titanium material film followed by one or more ALD cycles to form a monolayer or more of a titanium oxide film. In some embodiments, two or more cycles are used to deposit each layer of the first titanium material film. In some embodiments, one ALD cycle for forming the titanium oxide film is carried out at regular intervals in the deposition process for forming the first titanium material film. For example, one ALD cycle for forming the titanium oxide film may be carried out for every 1, 2, 3, 4, 5, 10, 15, 20 or more deposition cycles for forming the first titanium material film, and ranges between each of these ratios (for example, 1:1 and 1:20) are also contemplated. In some embodiments two ALD cycles for forming the titanium oxide film are carried out for every about 10 deposition cycles for forming the first titanium material film. For instance, two ALD cycles for forming the titanium oxide film are carried out for every about 10 deposition cycles for forming the titanium nitride film. In this way a titanium nanolaminate can be formed comprising titanium material film layers comprising nitrogen, oxygen, and/or carbon with layers of the second titanium oxide film at regular intervals.

In some embodiments, multiple ALD cycles can be used to deposit the first titanium film comprising nitrogen, oxygen, and/or carbon followed by multiple ALD cycles to form the second titanium oxide. In some embodiments, two or more cycles are used to deposit each layer of the first film. In some embodiments, two or more cycles are used to deposit each layer of the second film. In some embodiments the titanium film comprising nitrogen deposition cycle is repeated more times than the deposition cycle for forming the second titanium oxide film. In some embodiments the number of titanium film comprising nitrogen deposition cycles is 2, 3, 4, 5, 10 or more times the number of the deposition cycles for the second titanium oxide film. For example, the titanium film comprising nitrogen deposition cycle can be repeated 10 times, followed by 2 cycles of the second titanium oxide film.

Thus, the stoichiometry of the resulting film can be precisely controlled by varying the ratio of second titanium oxide film deposition cycles to first titanium film comprising nitrogen deposition cycles. The thickness of each deposited layer can be controlled by selecting the number ALD cycles for each material, and the thickness of the total nanolaminate can be controlled by selecting the total number of ALD cycles for each material.

In some embodiments, multiple ALD cycles can be used to deposit about a nanometer or more of the first or second film. In some embodiments about 0.5 nm to about 100 nm of material is deposited. In some embodiments about 1 nm to about 50 nm of material is deposited. In some embodiments, preferably about 3 to 30 nm of material is deposited. In some embodiments about 20 nm of material is deposited for example in spacer or sacrificial layer processes.

In some embodiments, multiple first and second films are formed in a nanolaminate stack. For example, the first and second deposition cycles can be alternated to form multiple alternating thin films of the first and second films.

The first and second films can be any of the materials described herein. In some embodiments the first film is a titanium nitride film and the second film is a titanium oxide film. In some embodiments the first film is a titanium oxynitride film and the second film is a titanium oxide film. In some embodiments the first film is a titanium oxycarbide film and the second film is a titanium oxide film. In some embodiments the first film is a titanium carbide film and the second film is a titanium oxide film.

The ALD type deposition processes described herein, for example thermal atomic layer deposition and plasma enhanced atomic layer deposition, are mostly surface-controlled (based on controlled reactions at the substrate surface) and thus has the advantage of providing high conformality at relatively low temperatures. However, in some embodiments, one or more of the precursors may at least partially decompose. Accordingly, in some embodiments the ALD type process described herein is a pure ALD process in which no decomposition of precursors is observed. In other embodiments reaction conditions, such as reaction temperature, are selected such that a pure ALD process is achieved and no precursor decomposition takes place. Generally the ALD type deposition processes described herein comprise alternately and sequentially contacting a substrate with separate precursors or reactants, for example using separate precursor pulses. However, in some embodiments two or more precursors or reactants may contact the substrate at the same time, for example a second precursor pulse may begin before a first precursor pulse has ended. Additionally, other deposition processes known in the art can also be used to deposit the nanolaminates materials, for example, CVD, RTCVD, etc.

In some embodiments, the nanolaminate film has a reduced crystallinity relative to a pure titanium oxide film. For example, a nanolaminate film may have a roughness of less than about 0.2 micron for Rq.

The nanolaminate thin films can also have superior properties to bulk films. For example, a nanolaminate can exhibit better selectivity than a silicon oxide film with the same total thickness. In some embodiments a titanium nanolaminate thin film may have a dry etch rate (DER) that is lower than the dry etch rate of silicon dioxide. In some embodiments the ratio of the DER of a titanium nanolaminate thin film to the DER of silicon dioxide may be about 1:3, about 1:5, or about 1:10. In some embodiments a titanium nanolaminate thin film may have a DER value that is substantially similar to that of pure titanium dioxide.

In some embodiments titanium nanolaminate thin films may have a wet etch rate (WER) that is lower than the wet etch rate of silicon dioxide. In some embodiments the ratio of the WER of a titanium nanolaminate thin film to the WER of silicon dioxide may be about 1:3, about 1:5, or about 1:10. In some embodiments a titanium nanolaminate thin film may have a WER value that is substantially similar to that of pure titanium dioxide.

In some embodiments titanium nanolaminate films of greater than 50 nm can be grown. In some embodiments titanium nanolaminate films of greater than 100 nm can be grown. In some embodiments, the film is from about 1 nm to about 200 nm thick, preferably from about 2 nm to about 100 nm thick. In some embodiments the film is from about 1 nm to about 20 nm thick. In some embodiments the film is from about 1 nm to about 10 nm thick.

The growth rate of each layer of the titanium nanolaminate thin film, and thus the growth rate of the titanium nanolaminate thin film, will vary depending on reaction conditions. In some embodiments the growth rate of a first titanium material is between about 0.01 and about 2.0 Å/cycle. In some embodiments the growth rate of the titanium oxide is between about 0.01 and about 2.0 Å/cycle. In some embodiments the growth rate of the titanium nanolaminate thin film is between about 0.01 and about 2.0 Å/cycle.

Titanium nanolaminate thin films deposited according to some of the embodiments discussed herein may comprise nitrogen. In some embodiments the ratio of nitrogen to oxygen in the titanium nanolaminate thin film is from about 1:2 to about 1000:1, preferably from about 1:1 to about 500:1 and more preferably about 10:1 to about 500:1. In some embodiments the amount of nitrogen in the deposited titanium nanolaminate thin film is from about 0.05 at-% to about 30 at-%, more preferably from about 0.1 at-% to about 10 at-% and most preferably from about 0.1 at-% to about 5 at-%. In some embodiments the deposited titanium nanolaminate thin film does not comprise an appreciable amount of carbon. However, in some embodiments a titanium nanolaminate film comprising carbon is deposited. In some embodiments the amount of carbon in the deposited titanium nanolaminate thin film is from about 0.05 at-% to about 30 at-%, more preferably from about 0.1 at-% to about 10 at-% and most preferably from about 0.1 at-% to about 5 at-%. In some instances the amount of carbon is less than about 1 at-%.

In some embodiments titanium nanolaminate thin films with various refractive indices (R.I.) are deposited. These films may be useful in, for example, optical applications such as in a CMOS image sensor. In some embodiments the R.I. of the deposition titanium nanolaminate thin film is substantially similar to the R.I. of pure $TiO_2$. In some embodiments the R.I. of the deposited titanium nanolaminate thin film may be from about 2.2 to about 2.7. In some embodiments the R.I. of the deposited titanium nanolaminate thin film may be from about 2.3 to about 2.5. In some embodiments the R.I. of the deposited titanium nanolaminate is about 2.4.

According to some embodiments, the titanium nanolaminate thin films may exhibit step coverage and pattern loading effects of greater than about 50%, preferably greater than about 80%, more preferably greater than about 90%, and most preferably greater than about 95%. In some cases step coverage and pattern loading effects can be greater than about 98% and in some case about 100% (within the accuracy of the measurement tool or method). These values can be achieved in aspect ratios of more than 2, preferably in aspect ratios more than 3, more preferably in aspect ratios more than 5 and most preferably in aspect ratios more than 8.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments the non-uniformity of a deposited titanium nanolaminate thin film may be less than about 10% (1 sigma), less than about 5%, less than about 3%, or less than about 1%.

FIG. 1 is a flow chart generally illustrating a process for forming a titanium nanolaminate thin film in accordance with some embodiments. According to certain embodiments, a titanium nanolaminate film is formed on a substrate by a process comprising at least one deposition supercycle 100, the supercycle 100 comprising:

depositing a first titanium material layer comprising nitrogen, oxygen, and/or carbon by at least one cycle of a first cyclical deposition process, for example a PEALD process, at step 110;

depositing a second titanium oxide by at least one cycle of a second cyclical deposition process, for example a PEALD process, at step 120;

optionally repeating, at step 130, at least one cycle of the first titanium material deposition step 110 and/or at least one cycle of the titanium oxide deposition step 120 until a titanium nanolaminate film of a desired thickness has been formed.

As described herein, at least one layer of a first titanium material comprising nitrogen, oxygen, and/or carbon is deposited by a cyclical deposition process at step 110. In some embodiments the cyclical deposition process may be an ALD type deposition process, for example a thermal atomic layer deposition process or a PEALD process as described herein. In some embodiments the first titanium material deposition process may comprise alternately and sequentially contacting the substrate in a reaction space with a titanium precursor and a second reactant comprising nitrogen and/or oxygen. In some embodiments multiple cycles of the first titanium material deposition process may be repeated until a first titanium material comprising nitrogen, oxygen, and/or carbon of a desired thickness is formed.

At step 120, and as described herein, at least one layer of a second titanium oxide thin film is deposited by a cyclical deposition process at step 120. In some embodiments the titanium oxide layer is deposited directly over the first titanium material layer. In some embodiments the cyclical deposition process may be an ALD type deposition process, for example a thermal atomic layer deposition process or a PEALD process as described herein. In some embodiments the second titanium oxide deposition process may comprise alternately and sequentially contacting the substrate in a reaction space with a titanium precursor and a second reactant comprising oxygen. In some embodiments multiple cycles of the second titanium oxide deposition process may be repeated until a second titanium oxide film of a desired thickness is formed.

One of both of the first titanium material deposition step 110 and the second titanium oxide deposition step 120 may be optionally repeated at step 130. In some embodiments the first titanium material deposition step 110 is repeated multiple times before the second titanium oxide deposition step 120 is repeated. Therefore, in some embodiments the titanium nanolaminate film may be formed at least in part from a titanium material comprising nitrogen, oxygen, and/or carbon and a titanium oxide, where the titanium material comprising nitrogen, oxygen, and/or carbon and the titanium oxide are provided at a ratio (titanium material comprising nitrogen, oxygen, and/or carbon/titanium oxide) from about 1:1 to about 100:1, preferably from about 1:1 to about 50:1, more preferably from about 1:1 to about 30:1, more preferably about 19:1.

In some embodiments a process for depositing a titanium nanolaminate thin film on a substrate in a reaction chamber by an atomic layer deposition (ALD) process comprises:

a first deposition cycle comprising alternately and sequentially contacting the substrate with a first vapor phase titanium precursor and a first reactant; and a second deposition cycle comprising alternately and sequentially contacting the substrate with a second vapor phase titanium precursor and a second reactant comprising oxygen.

In some embodiments a process for depositing a titanium nanolaminate thin film on a substrate in a reaction chamber comprises at least one supercycle, the supercycle comprising:

a first titanium material layer deposition process comprising at least one cycle, the cycle comprising:

contacting the substrate with a first vapor phase titanium precursor;

removing excess first vapor phase titanium precursor and reaction by-products, if any;

contacting the substrate with a first vapor phase reactant;

removing excess first vapor phase reactant and reaction by-products, if any;

repeating the contacting and removing steps until a first titanium material layer comprising nitrogen, oxygen, and/or carbon of a desired thickness is formed;

a second titanium oxide layer deposition process comprising at least one cycle, the cycle comprising:

contacting the substrate with a second vapor phase titanium precursor;

removing excess second vapor phase titanium precursor and reaction by-products, if any;

contacting the substrate with a second vapor phase reactant comprising oxygen;

removing excess second vapor phase reactant and reaction by-products, if any;

repeating the contacting and removing steps until a second titanium oxide layer of a desired thickness is formed; and repeating the first titanium material deposition process and the second titanium oxide deposition process until a titanium nanolaminate thin film of a desired thickness is formed.

Figure 2:
FIG. 2 is an illustration of an exemplary titanium nanolaminate film comprising alternating titanium oxide and titanium nitride layers.

FIG. 2 shows an illustration of an exemplary titanium nanolaminate film 200 comprising alternating titanium nitride (TiN) 210 and titanium oxide (TiO) 220 layers at a ratio about 1:1 and formed according to the process described above with reference to FIG. 1.

Atomic Layer Deposition

In context of the present invention, "an ALD type process" generally refers to a process for depositing thin films on a substrate molecular layer by molecular layer. This controlled deposition is made possible by self-saturating chemical reactions on the substrate surface. Vapor phase reactants are conducted alternately and sequentially into a reaction chamber and contacted with a substrate located in the chamber to provide a surface reaction. Typically, a pulse of a first reactant is provided to the reaction chamber where it chemisorbs on the substrate surface in a self-limiting manner. Any excess first reactant (and reactant byproducts, if any) is then removed and a pulse of a second reactant is provided to the reaction chamber. The second reactant reacts with the adsorbed first reactant, also in a self-limiting manner. Excess second reactant and reaction by-products, if any, are removed from the reaction chamber. Additional reactants may be supplied in each ALD cycle, depending on the composition of the thin film being deposited. This cycle is repeated to form a metal containing thin film of desired thickness.

The pressure and the temperature of the reaction chamber are adjusted to a range where physisorption (i.e., condensation of gases) and thermal decomposition of the precursors are avoided. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the reactant molecules.

Gas phase reactions between precursors and any undesired reactions with reaction by-products, if any, are preferably inhibited or prevented to maintain self-limiting behavior and minimize contamination. Reactant pulses are separated from each other and the reaction chamber is purged with the aid of an inactive gas (e.g. nitrogen or argon) and/or evacuated between reactant pulses to remove surplus gaseous reactants and reaction by-products from the chamber. The principles of ALD type processes are discussed e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

An extensive description of ALD precursors and ALD-grown materials can be found in the Handbook of Thin Film Materials, Vol. 1: Deposition and Processing of Thin Films, Chapter 2 "Atomic Layer Deposition", pp. 103-159, Academic Press 2002, incorporated by reference herein.

In the context of the present application "a reaction space" designates generally a reaction chamber, or a defined volume therein, in which the conditions can be adjusted so that deposition of a thin film is possible.

In the context of the present application, "an ALD type reactor" is a reactor where the reaction space is in fluid communication with an inactive gas source and at least one, preferably at least two precursor sources such that the precursors can be pulsed into the reaction space. The reaction space is also preferably in fluid communication with a vacuum generator (e.g. a vacuum pump), and the temperature and pressure of the reaction space and the flow rates of gases can be adjusted to a range that makes it possible to grow thin films by ALD type processes. The reactor also includes the mechanism, such as valves and programming, to pulse and maintain separation between the reactants.

As is well known in the art, there are a number of variations of the basic ALD method, including PEALD (plasma enhanced ALD) in which plasma is used for activating reactants. Conventional ALD or thermal ALD refers to an ALD method where plasma is not used but where the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence or cycle. As used herein, the term "ALD" covers both PEALD and thermal ALD.

In a typical ALD type process, a gas phase pulse of first titanium reactant is introduced into the reaction space of an ALD reactor, where it is contacted with a suitable substrate. No more than a monolayer of the metal precursor adsorbs on the substrate surface in a self-limiting manner. Excess titanium precursor is removed from the reaction space by purging and/or evacuating the chamber.

Subsequently, a gas phase pulse of a second reactant is introduced into the reaction space, where it reacts with the adsorbed titanium precursor. The second reactant will be selected based on the nature of the titanium containing film being deposited. For example it may contribute oxygen (to form titanium oxide) or nitrogen (to form titanium nitride).

After sufficient time for it to react with the adsorbed first reactant, the second reactant is removed from the reaction space. If a thin film of a desired thickness has been formed, the process may be terminated. However, if additional deposition is desired, the cycle may be begun again. As discussed below, subsequent cycles may or may not be identical to the previous cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

Optionally, there may some overlap in the provision of the first and second reactants. For example a first reactant may be provided into the reaction space and a second reactant may optionally be provided into the reaction space before the first reactant has been removed. In some embodiments the second reactant may be provided simultaneously with the first reactant, while in other embodiments the first reactant may be provided and the second reactant may be provided after a desired amount of time has elapsed.

By alternating the provision of the titanium precursor and the second reactant, a titanium containing layer of the desired thickness can be deposited. A growth rate of about from 0.1 to 1.5 Å/cycle is typically achieved in ALD processes. Growth rates and suitable growth temperatures depend, in part, upon the reactants chosen and can be readily determined by the skilled artisan.

Optionally, an inactive gas can be used as a carrier gas during deposition. Inactive gas may also be used to purge the reaction chamber of excess reactant and reaction by-products, if any.

The deposition can be carried out at normal pressure, but it is preferred to operate the process at reduced pressure. Thus, the pressure in the reactor is typically from about 50 Pa to about 1000 Pa, preferably about 200 Pa to about 400 Pa. In some embodiments the pressure in the reactor may be about 400 Pa.

The reaction temperature can be varied depending, in part, on the evaporation temperature and the decomposition temperature of the precursor. In some embodiments, the range is from about 20° C. to about 500° C., preferably from about 30° C. to about 200° C., or from about 200° C. to about 400° C. The substrate temperature is preferably low enough to prevent thermal decomposition of the gaseous reactants. On the other hand, the substrate temperature is preferably high enough to keep the source materials in gaseous phase and avoid condensation. Further, the temperature is preferably sufficiently high to provide the activation energy for the surface reaction.

The substrate can comprise various types of materials. The substrate may be, for example, a semiconductor substrate. In some embodiments the substrate may comprise silicon. In some embodiments the substrate may comprise at least one of silicon dioxide and silicon nitride.

Titanium Oxide Deposition

Methods for depositing titanium oxide films by ALD are known in the art and can be utilized in forming the titanium nanolaminates described herein. In some embodiments a titanium oxide film is formed by alternately and sequentially contacting a substrate with a first titanium precursor and a second oxygen precursor. One or both reactants can be provided with the aid of a carrier gas. In some embodiments, excess reactants and reaction byproducts are removed from the reaction space, for example with the aid of an inert purge gas.

In some embodiments, plasma enhanced ALD (PEALD) processes are used to deposit titanium oxide films. In some embodiments, thin titanium oxide films are formed by repetition of an ALD cycle. Preferably, for forming titanium oxide films, each ALD cycle comprises at least two distinct phases. The contacting and removal of a reactant from the substrate surface may be considered a phase. In a first phase, a first reactant comprising titanium contacts the substrate surface and conformally forms no more than about one monolayer on the substrate. This reactant is also referred to herein as "the titanium precursor," "titanium-containing precursor," or "titanium reactant" and may be, for example, titanium tetraisopropoxide (TTIP), tetrakis(dimethylamino) titanium (TDMAT), tetrakis(diethylamino)titanium (TDEAT), tetrakis(ethylmetylamino)titanium (TEMAT).

In a second phase, a second reactant comprising a reactive species or multiple reactive species contacts the substrate surface and may convert adsorbed titanium to titanium oxide. In some embodiments the second reactant comprises an oxygen precursor. In some embodiments, the reactive species comprises one or more excited species. In some embodiments the second reactant comprises one or more species from an oxygen containing plasma. In some embodiments, the second reactant comprises oxygen radicals, oxygen atoms, and/or oxygen plasma. The second reactant may comprise other species that are not oxygen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments the second reactant may comprise a gas that acts as a carrier gas for the second reactant. In some embodiments a carrier gas that is used to form a plasma may flow constantly throughout the deposition process but only be activated intermittently. Additional phases may be added and phases may be removed as desired to adjust the composition of the final film.

One or more of the reactants may be provided with the aid of a carrier gas, such as Ar or He. In some embodiments the titanium precursor and the second reactant are provided with the aid of a carrier gas. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

In some embodiments a titanium oxide thin film is formed on a substrate surface by an ALD type process comprising at least one titanium oxide deposition cycles, the deposition cycle comprising:

contacting the substrate surface with a first vapor phase reactant comprising a first titanium precursor into the reaction chamber to form a layer of the titanium precursor on the substrate; and contacting the substrate with a second vapor phase oxygen reactant such that the second reactant reacts with the first Ti precursor on the substrate in a self-limiting manner to form titanium oxide.

In some embodiments excess first reactant is removed from the reaction chamber after contacting the substrate with the first reactant and prior to contacting the substrate with the second reactant, for example by flowing a purge gas into the reaction chamber, or by continuing flow of an inert carrier gas while stopping the flow of reactant. In some embodiments excess second reactant and reaction byproducts, if any, are removed from the reaction chamber after contacting the substrate with the second vapor phase reactant and prior to any further processing, for example by flowing a purge gas into the reaction chamber, or by continuing flow of an inert carrier gas while stopping the flow of reactant.

This can be referred to as a titanium oxide deposition cycle. Each titanium oxide deposition cycle typically forms at most about one monolayer of titanium oxide selectively on the substrate surface. In some cases where the deposition temperature is above the decomposition temperature of the titanium precursor, more than one monolayer of titanium oxide can be formed in each titanium oxide deposition cycle. The titanium oxide deposition cycle is repeated until a layer of the nanolaminate of a desired thickness is formed.

Although the illustrated titanium oxide deposition cycle begins with provision of the first titanium precursor, in other embodiments the deposition cycle begins with the provision of the second reactant. It will be understood by the skilled artisan that provision of the first titanium precursor and second reactant are interchangeable in the ALD cycle.

In some embodiments, the reactants and reaction by-products can be removed from the reaction chamber by stopping the flow of reactant while continuing the flow of an inert carrier gas such as nitrogen or argon.

In some embodiments, the ALD process may be a plasma ALD (PEALD) process. In some embodiments the process may be a thermal ALD process.

As mentioned above, in some embodiments one or more titanium oxide layers in a titanium nanolaminate may be deposited by a CVD process, such as a pulsed CVD process, in which a Ti precursor and an oxygen precursor are provided to the reaction chamber.

Exemplary oxygen reactants that may be used include, but are not limited to water, molecular oxygen, ozone, oxygen plasma, oxygen radicals or oxygen atoms.

In some embodiments, multiple ALD cycles can be used to deposit an oxide layer to a desired thickness in a nanolaminate. For example, in some embodiments about 1 to about 1000 ALD deposition cycles are performed. The skilled artisan will appreciate that the number of cycles can be selected based on the desired thickness of the layer in the nanolaminate.

In some embodiments the titanium precursor contact duration is from about 0.1 to 1.0 seconds, preferably about 0.4 seconds. Conditions are preferably selected such that no more than about one monolayer of the titanium precursor is adsorbed on the substrate surface in a self-limiting manner. In some embodiments the appropriate titanium precursor contact duration can be longer or shorter depending on the particular circumstances. The appropriate contact duration can be readily determined by the skilled artisan based on the particular circumstances.

In some embodiments the removal duration is from about 0.1 to about 1.0 seconds. In some embodiments the appropriate titanium precursor removal duration can be longer or shorter, depending on the particular circumstances. The appropriate removal duration can be readily determined by the skilled artisan based on the particular circumstances. The typical precursor purge duration is also from about 0.1 to about 1.0 seconds. This is also depends on each condition.

In some embodiments the second reactant contact duration is from about 0.1 to 1.0 seconds, preferably about 0.2 seconds. In some embodiments the appropriate second reaction contact duration can be longer or shorter depending on the particular circumstances. The appropriate contact duration can be readily determined by the skilled artisan based on the particular circumstances.

In some embodiments the removal duration is from about 0.1 to about 1.0 seconds. In some embodiments the appropriate second precursor removal duration can be longer or shorter, depending on the particular circumstances. The appropriate removal duration can be readily determined by the skilled artisan based on the particular circumstances.

A plasma may be generated by applying RF power to the second reactant. The RF power may be applied to second reactant that flows during the second reactant plasma pulse time, that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 100 W to about 1000 W, preferably from about 200 W to about 500 W.

According to some embodiments of the present disclosure, PEALD reactions may be performed at temperatures ranging from about 20° C. to about 500° C., preferably from about 70° C. to about 200° C. In some embodiments the PEALD reactions may be performed at pressures ranging from about 50 Pa to about 1000 Pa, preferably from about 200 Pa to about 400 Pa.

Titanium Nitride Deposition

Methods for depositing titanium nitride films by ALD are known in the art and can be utilized in forming the titanium nanolaminates described herein. In some embodiments a titanium nitride film is formed by alternately and sequentially contacting a substrate with a first titanium precursor and a second nitrogen precursor. One or both reactants can be provided with the aid of a carrier gas. In some embodiments, excess reactants and reaction byproducts are removed from the reaction space, for example with the aid of an inert purge gas.

In some embodiments, plasma enhanced ALD (PEALD) processes are used to deposit TiN films. In some embodiments, thin TiN films are formed by repetition of an ALD cycle. Preferably, for forming TiN films, each ALD cycle comprises at least two distinct phases. The contacting and removal of a reactant from the substrate surface may be considered a phase. In a first phase, a first reactant comprising titanium contacts the substrate surface and conformally forms no more than about one monolayer on the substrate. This reactant is also referred to herein as "the titanium precursor," "titanium-containing precursor," or "titanium reactant" and may be, for example, titanium tetraisopropoxide (TTIP), tetrakis(dimethylamino)titanium (TDMAT), tetrakis(diethylamino)titanium (TDEAT), tetrakis(ethylmetylamino)titanium (TEMAT).

In a second phase, a second reactant comprising a reactive species or multiple reactive species contacts the substrate surface and may convert adsorbed titanium to TiN. In some embodiments the second reactant comprises an a nitrogen precursor. In some embodiments, the reactive species comprises one or more excited species. In some embodiments the second reactant comprises one or more species from a nitrogen containing plasma. In some embodiments, the second reactant comprises nitrogen radicals, nitrogen atoms, and/or nitrogen plasma.

The second reactant may comprise other species that are not nitrogen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments the second reactant may comprise a gas that acts as a carrier gas for the second reactant. In some embodiments a carrier gas that is used to form a plasma may flow constantly throughout the deposition process but only be activated intermittently. Additional phases may be added and phases may be removed as desired to adjust the composition of the final film.

One or more of the reactants may be provided with the aid of a carrier gas, such as Ar or He. In some embodiments the titanium precursor and the second reactant are provided with the aid of a carrier gas. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

In some embodiments a titanium nitride thin film is formed on a substrate surface by an ALD type process comprising at least one titanium nitride deposition cycles, the deposition cycle comprising:

contacting the substrate surface with a first vapor phase reactant comprising a first Ti precursor into the reaction chamber to form a layer of the Ti precursor on the substrate; and contacting the substrate with a second vapor phase nitrogen reactant such that the second reactant reacts with the first Ti precursor on the substrate in a self-limiting manner to form TiN.

In some embodiments excess first reactant is removed from the reaction chamber after contacting the substrate with the first reactant and prior to contacting the substrate with the second reactant, for example by flowing a purge gas into the reaction chamber, or by continuing flow of an inert carrier gas while stopping the flow of reactant. In some embodiments excess second reactant and reaction byproducts, if any, are removed from the reaction chamber after contacting the substrate with the second vapor phase reactant and prior to any further processing, for example by flowing a purge gas into the reaction chamber, or by continuing flow of an inert carrier gas while stopping the flow of reactant.

This can be referred to as a TiN deposition cycle. Each TiN deposition cycle typically forms at most about one monolayer of TiN selectively on the substrate surface. In some cases where the deposition temperature is above the decomposition temperature of the Ti precursor, more than one monolayer of TiN can be formed in each TiN deposition cycle. The TiN deposition cycle is repeated until a layer of the nanolaminate of a desired thickness is formed.

Although the illustrated TiN deposition cycle begins with provision of the first Ti precursor, in other embodiments the deposition cycle begins with the provision of the second reactant. It will be understood by the skilled artisan that provision of the first Ti precursor and second reactant are interchangeable in the ALD cycle.

In some embodiments, the reactants and reaction by-products can be removed from the reaction chamber by stopping the flow of reactant while continuing the flow of an inert carrier gas such as nitrogen or argon.

As mentioned above, in some embodiments one or more TiN layers in a titanium nanolaminate may be deposited by a CVD process, such as a pulsed CVD process, in which a Ti precursor and a nitrogen precursor are provided to the reaction chamber.

The second nitrogen precursor for ALD deposition of a titanium nitride film may include for example, $NH_3$, $N_2H_2$, nitrogen containing plasma, radicals or atoms, such as mixture of $N_2/H_2$ plasma, radicals or atoms. In some embodiments the nitrogen reactant is $NH_3$. Nitrogen containing reactants may also be selected from amino containing silanes, amino containing silazanes, amino containing germanes or amino containing boranes. In some embodiments the second reactant can include compounds having nitrogen, compounds having hydrogen, and an inert carrier gas. In some embodiments the second reactant can include compounds having hydrogen and an inert carrier gas. Various reactant flow rates can be suitable. In some embodiments the second reactant may comprise $H_2$, and Ar. In some embodiments a flow rate for $H_2$ is from about 0.1 slm to about 10 slm, preferably about 0.5 slm. In some embodiments a flow rate for Ar is from about 0 slm to about 10 slm, preferably about 3.5 slm.

In some embodiments, multiple ALD cycles can be used to deposit a nitride layer to a desired thickness in a nanolaminate. For example, in some embodiments about 2 to about 1000 ALD deposition cycles are performed. The skilled artisan will appreciate that the number of cycles can be selected based on the desired thickness of the layer in the nanolaminate.

In some embodiments the titanium precursor contact duration is from about 0.1 to 1.0 seconds, preferably about 0.4 seconds. Conditions are preferably selected such that no more than about one monolayer of the titanium precursor is adsorbed on the substrate surface in a self-limiting manner. In some embodiments the appropriate titanium precursor contact duration can be longer or shorter depending on the particular circumstances. The appropriate contact duration can be readily determined by the skilled artisan based on the particular circumstances.

In some embodiments the removal duration is from about 0.1 to about 1.0 seconds. In some embodiments the appropriate titanium precursor removal duration can be longer or shorter, depending on the particular circumstances. The appropriate removal duration can be readily determined by the skilled artisan based on the particular circumstances. The typical precursor purge duration is also about 0.1 to about 1.0 seconds. This is also depends on each condition.

In some embodiments the second reactant contact duration is from about 0.1 to 60 seconds, preferably about 1 second. In some embodiments the appropriate second reaction contact duration can be longer or shorter depending on the particular circumstances. The appropriate contact duration can be readily determined by the skilled artisan based on the particular circumstances.

In some embodiments the removal duration is from about 0.1 to about 1.0 seconds. In some embodiments the appropriate second precursor removal duration can be longer or shorter, depending on the particular circumstances. The appropriate removal duration can be readily determined by the skilled artisan based on the particular circumstances.

A plasma may be generated by applying RF power to the second reactant. The RF power may be applied to second reactant that flows during the second reactant plasma pulse time, that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 100 W to about 1000 W, preferably from about 200 W to about 500 W. In some embodiments the RF power applied to the second reactant is about 500 W.

According to some embodiments of the present disclosure, PEALD reactions may be performed at temperatures ranging from about 20° C. to about 500° C., preferably from about 70° C. to about 200° C. In some embodiments the PEALD reactions may be performed at pressures ranging from about 50 Pa to about 1000 Pa, preferably from about 200 Pa to about 400 Pa. In some embodiments the PEALD reactions may be performed at about 400 Pa.

Titanium Oxynitride Deposition

In some embodiments, plasma enhanced ALD (PEALD) processes are used to deposit $TiO_xN_y$ films. In some embodiments, thin $TiO_xN_y$ films are formed by repetition of an ALD cycle. Preferably, for forming $TiO_xN_y$ films, each ALD cycle comprises at least two distinct phases. The contacting and removal of a reactant from the substrate surface may be considered a phase. In a first phase, a first reactant comprising titanium contacts the substrate surface and conformally forms no more than about one monolayer on the substrate. This reactant is also referred to herein as "the titanium precursor," "titanium-containing precursor," or "titanium reactant" and may be, for example, titanium tetraisopropoxide (TTIP), tetrakis(dimethylamino)titanium (TDMAT), tetrakis(diethylamino)titanium (TDEAT), tetrakis(ethylmetylamino)titanium (TEMAT).

In a second phase, a second reactant comprising a reactive species or multiple reactive species contacts the substrate surface and may convert adsorbed titanium to $TiO_xN_y$. In some embodiments the second reactant comprises an oxygen precursor and a nitrogen precursor. In some embodiments, the reactive species comprises one or more excited species. In some embodiments the second reactant comprises one or more species from a nitrogen and oxygen containing plasma. In some embodiments, the second reactant comprises nitrogen radicals, nitrogen atoms, and/or nitrogen plasma and oxygen radicals, oxygen atoms, and/or oxygen plasma. The second reactant may comprise other species that are not nitrogen or oxygen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments the second reactant may comprise a gas that acts as a carrier gas for the second reactant. In some embodiments a carrier gas that is used to form a plasma may flow constantly throughout the deposition process but only be activated intermittently. Additional phases may be added and phases may be removed as desired to adjust the composition of the final film.

One or more of the reactants may be provided with the aid of a carrier gas, such as Ar or He. In some embodiments the titanium precursor and the second reactant are provided with the aid of a carrier gas. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

In some embodiments the substrate is contacted with a first reactant and the substrate is moved such that it is contacted with a second reactant. In some embodiments the substrate can be moved within a single reaction space. In some embodiments the substrate can be moved from a first reaction space to a second, different reaction space.

As discussed in more detail below, in some embodiments for depositing a $TiO_xN_y$ film, one or more deposition cycles begin with contacting the substrate surface with the titanium precursor, followed by the second reactant. In other embodiments deposition may begin with contacting the surface with the second reactant, followed by the titanium precursor.

In some embodiments, if necessary, the exposed surfaces of the substrate or workpiece can be pretreated to provide reactive sites to react with the first phase of the ALD process.

In some embodiments a separate pretreatment step is not required. In some embodiments the substrate is pretreated to provide a desired surface termination. In some embodiments the substrate is pretreated with plasma.

Excess reactant and reaction byproducts, if any, are typically removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films. In some other embodiments the reaction chamber is purged by stopping the flow of a precursor or reactant and continuing to flow carrier gas into the chamber. In some embodiments excess reactant and reaction byproducts are removed from the vicinity of the substrate by moving the substrate. In some embodiments the substrate is moved within a reaction chamber. In some embodiments the substrate is moved from a first reaction chamber to a second, different reaction chamber.

As mentioned above, in some embodiments a carrier gas is provided to the reaction chamber continuously during each deposition cycle, or during the entire ALD process, and reactive species are provided. Reactive species may be provided by generating a plasma in the gas, either in the reaction chamber or upstream of the reaction chamber, and may also be provided by injection into the carrier gas. In some embodiments the carrier gas may comprise helium, or argon. In some embodiments the carrier gas may also serve as a purge gas for the first and/or second reactant (or reactive species). In some embodiments the purge gas may be a reactant, for example, flowing the second reactant may serve as a purge gas for a first titanium precursor and also serve as reactive species when a plasma is formed in the gas. In some embodiments, nitrogen, argon, or helium may serve as a purge gas for a first precursor and a source of excited species for converting the titanium precursor into the $TiO_xN_y$ film.

The ALD cycle is repeated until a film of the desired thickness and composition is obtained. In some embodiments the deposition parameters, such as the flow rate, flow time, contact time, purge time, removal time, RF Power, RF on time and/or precursors themselves, may be varied in one or more deposition cycles during the ALD process in order to obtain a film with the desired characteristics.

The term "pulse" may be understood to comprise feeding reactant into the reaction chamber for a predetermined amount of time. The term "pulse" does not restrict the length or duration of the pulse and a pulse can be any length of time.

In some embodiments, the titanium precursor contacts the substrate first. After an initial surface termination, if necessary or desired, the substrate is contacted with a titanium precursor. In accordance with some embodiments, the titanium precursor contacts the substrate via a first titanium precursor pulse comprising a carrier gas flow and a volatile titanium species, such as TTIP, TDMAT, TDEAT, or TEMAT, that is reactive with the substrate surfaces of interest. Accordingly, the titanium precursor adsorbs upon these substrate surfaces. The first precursor self-saturates the substrate surfaces such that any excess constituents of the first precursor pulse do not further react with the molecular layer formed by this process.

The titanium precursor preferably contacts the substrate in gaseous form. The titanium precursor gas is considered "volatile" for purposes of the present description if the species exhibits sufficient vapor pressure under the process conditions to transport the species to the substrate in sufficient concentration to saturate exposed surfaces. In some embodiments the titanium precursor contacts the substrate by injecting the titanium precursor into the carrier gas. In some other embodiments the titanium precursor contacts the substrate separately from any carrier gas or inert gas flow.

In some embodiments the titanium precursor contact duration is from about 0.1 to 1.0 seconds. Conditions are preferably selected such that no more than about one monolayer of the titanium precursor is adsorbed on the substrate surface in a self-limiting manner. In some embodiments the appropriate titanium precursor contact duration can be longer or shorter depending on the particular circumstances. The appropriate contact duration can be readily determined by the skilled artisan based on the particular circumstances.

After sufficient time for a molecular layer to adsorb on the substrate surface, excess titanium precursor is then removed from the substrate surface. In some embodiments the excess titanium precursor is removed by stopping the flow of the titanium precursor while continuing to flow a carrier gas or purge gas for a sufficient time to diffuse or purge excess reactants and reactant by-products, if any, from the reaction space. In some embodiments the excess titanium precursor is removed with the aid of an inert gas that is flowing throughout the ALD cycle. In some embodiments the titanium precursor is removed by stopping the flow of the titanium precursor and starting to flow a carrier gas or purge gas. In some embodiments the titanium precursor is removed from the substrate surface by moving the substrate within a reaction chamber. In some embodiments the titanium precursor is removed from the substrate surface by moving the substrate from a first reaction chamber to a second, different reaction chamber.

In some embodiments the removal duration is from about 0.1 to about 1.0 seconds. In some embodiments the appropriate titanium precursor removal duration can be longer or shorter, depending on the particular circumstances. The appropriate removal duration can be readily determined by the skilled artisan based on the particular circumstances. The typical precursor purge duration is also 0.1~1.0 sec. This is also depends on each condition.

In the second phase, a plurality of reactive species, such as a plasma comprising oxygen and nitrogen reactive species contact the surface of the substrate. A carrier gas may be flowed continuously to the reaction chamber during each ALD cycle in some embodiments. A plasma may be formed by generating a plasma in the second reactant in the reaction chamber or upstream of the reaction chamber, for example by flowing the second reactant through a remote plasma generator. In some embodiments, plasma is generated in the flowing second reactant. In some embodiments the second reactant is contacts the surface of the substrate before the plasma is ignited or nitrogen and oxygen atoms or radicals are formed. In some embodiments the second reactant is introduced into the reaction chamber by injecting the second reactant into a carrier gas. In some other embodiments the second reactant contacts the surface of the substrate separately from any carrier gas or inert gas.

In some embodiments the second reactant contact duration is from about 0.1 to 1.0 seconds. In some embodiments the appropriate second reaction contact duration can be longer or shorter depending on the particular circumstances. The appropriate contact duration can be readily determined by the skilled artisan based on the particular circumstances.

In some embodiments the substrate may be contacted with the second reactant while the titanium precursor is still present at the substrate surface. In some embodiments the second reactant may contact the substrate prior to the removal of the titanium precursor from the surface of the substrate. In some embodiments the substrate may be contacted with the titanium precursor while the second reactant is still present at the substrate surface. In some embodiments the titanium precursor may contact the substrate prior to the removal of the second reactant from the surface of the substrate.

After a time period sufficient to completely saturate and react the previously adsorbed molecular layer with the plasma pulse, any excess reactant and reaction byproducts are removed from the substrate surface. As with the removal of the first reactant/precursor, in some embodiments this step may comprise stopping the generation of reactive species in the second reactant and continuing to flow the carrier gas for a time period sufficient for excess reactive species and volatile reaction by-products to diffuse out of and be purged from the reaction space. In some other embodiments removal may comprise stopping generating reactive species in the second reactant, stopping the flow of the second reactant, and continuing to flow the carrier gas. In other embodiments the generation of reactive species in the second reactant is stopped and a separate purge gas may be used. In some embodiments the generation of reactive species in the second reactant is stopped, the flow of second reactant into the reaction chamber is stopped, and separate purge gas may be used. In some embodiments the substrate is moved such that the second reactant/precursor no longer contacts the substrate. In some embodiments the substrate is moved within a reaction chamber. In some embodiments the substrate is moved from a first reaction chamber to a second, different reaction chamber. Together, the second reactant plasma provision and removal represent a second phase in a titanium oxynitride atomic layer deposition cycle.

In some embodiments the removal duration is from about 0.1 to about 1.0 seconds. In some embodiments the appropriate second precursor removal duration can be longer or shorter, depending on the particular circumstances. The appropriate removal duration can be readily determined by the skilled artisan based on the particular circumstances. A plasma may be generated by applying RF power to the second reactant. The RF power may be applied to second reactant that flows during the second reactant plasma pulse time, that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 100 W to about 1000 W, preferably from about 200 W to about 500 W.

The two phases together represent one ALD cycle, which is repeated to form $TiO_xN_y$ thin films of a desired thickness. While the ALD cycle is generally referred to herein as beginning with the titanium precursor phase, it is contemplated that in other embodiments the cycle may begin with the second reactant phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the titanium phase.

Additional phases may be added and phases may be removed as desired to adjust the composition of the final film. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

According to some embodiments of the present disclosure, PEALD reactions may be performed at temperatures ranging from about 20° C. to about 500° C., preferably from about 70° C. to about 200° C. In some embodiments the PEALD reactions may be performed at pressures ranging from about 50 Pa to about 1000 Pa, preferably from about 200 Pa to about 400 Pa.

In some embodiments a titanium oxynitride plasma enhanced ALD deposition cycle that can be used to deposit a titanium oxynitride thin film in accordance with some embodiments on the invention. According to certain embodiments, a titanium oxynitride thin film is formed on a substrate by an ALD-type process comprising at least one titanium oxynitride deposition cycles, each titanium oxynitride deposition cycle comprising:

(1) contacting a substrate with a titanium reactant such that the titanium compound adsorbs on the substrate surface;

(2) removing excess titanium precursor and any byproducts from the substrate surface;

(3) contacting the substrate with a second reactant comprising a plurality of reactive species generated by plasma, the plurality of reactive species comprising nitrogen and oxygen; and (4) removing excess second reactant and reaction byproducts from the substrate surface.

The contacting and removing steps are repeated until a thin film of a desired thickness and composition is obtained.

As discussed above, the second reactant in a PEALD process used to form $TiO_xN_y$ according to the present disclosure may comprise a nitrogen precursor and an oxygen precursor, which may comprise plasma generated from oxygen and nitrogen precursors. Suitable plasma compositions include nitrogen plasma, radicals of nitrogen, or atomic nitrogen, and oxygen plasma, radicals of oxygen, or atomic oxygen in one form or another. In some embodiments a plasma may also contain hydrogen, such as hydrogen plasma, radicals of hydrogen, or atomic hydrogen in one form or another. And in some embodiments, a plasma may also contain noble gases, such as He, Ne, Ar, Kr and Xe, preferably Ar or He, in plasma form, as radicals, or in atomic form. In some embodiments, the second reactant does not comprise any species from a noble gas, such as Ar. Thus, in some embodiments plasma is not generated in a gas comprising a noble gas.

In some embodiments the second reactant may comprise plasma formed from both compounds having N and compounds having O, such as a mixture of $N_2$ and $O_2$, or a mixture of $NH_3$ and $O_2$. In some embodiments the second reactant may comprise plasma from compounds having O and may not comprise compounds having N. In some embodiments the second reactant may be formed at least in part, from an N-containing compound and an O-containing compound, where the N-containing compound and O-containing compound are provided at a ratio (N-containing compound/O-containing compound) from about 1:1 to about 100:1, preferably from about 10:1 to about 30:1. In some embodiments the ratio is from about 1:2 to about 250:1. In some embodiments the ratio is about 19:1. In some embodiments the second reactant may be formed at least in part, from $N_2$ and $O_2$, where the $N_2$ and $O_2$ are provided at a ratio ($N_2/O_2$) from about 1:1 to about 100:1, preferably from about 10:1 to about 30:1. In some embodiments the second reactant may be formed at least in part, from $NH_3$ and $O_2$, where the $NH_3$ and $O_2$ are provided at a ratio ($NH_3/O_2$) from about 1:1 to about 100:1, preferably from about 10:1 to about 30:1.

The compounds having N may be selected from at least one of $N_2$, $NH_3$, and $N_2H_2$. The compounds having O may be selected from at least one of $O_3$, $N_2O$, $CO_2$, CO, $H_2O$, and $H_2O_2$.

The second reactant may be formed in some embodiments remotely via plasma discharge ("remote plasma") away from the substrate or reaction space. In some embodiments, the second reactant may be formed in the vicinity of the substrate or directly above substrate ("direct plasma").

In some embodiments the second reactant may be provided into a reaction chamber In some embodiments a suitable second reactant can include compounds having nitrogen, compounds having O, and an inert carrier gas. Various reactant flow rates can be suitable. In some embodiments the second reactant may comprise $N_2$, $O_2$, and Ar. In some embodiments a flow rate for $N_2$ is from about 0.1 to about 10 slm. In some embodiments a flow rate for O2 is from about 0.001 slm to about 10 slm. In some embodiments a flow rate for Ar is from about 0 slm to about 10 slm.

Titanium Oxycarbide Deposition

In some embodiments, plasma enhanced ALD (PEALD) processes are used to deposit $TiO_xC_y$ films. Briefly, a substrate or workpiece is subjected to alternately repeated surface reactions. In some embodiments, thin $TiO_xC_y$ films are formed by repetition of an ALD cycle. Preferably, for forming $TiO_xC_y$ films, each ALD cycle comprises at least two distinct phases. The contacting and removal of a reactant from the substrate surface may be considered a phase. In a first phase, a first reactant comprising titanium contacts the substrate surface and conformally forms no more than about one monolayer on the substrate. This reactant is also referred to herein as "the titanium precursor," "titanium-containing precursor," or "titanium reactant" and may be, for example, TDMAT.

In a second phase, a second reactant comprising a reactive species or multiple reactive species contacts the substrate surface and may convert adsorbed titanium to $TiO_xC_y$. In some embodiments the second reactant comprises an oxygen precursor and a nitrogen precursor. In some embodiments the second reactant does not comprise a nitrogen precursor. In some embodiments, the reactive species comprises one or more excited species. In some embodiments the second reactant comprises one or more species from a nitrogen and oxygen containing plasma. In some embodiments, the second reactant comprises nitrogen radicals, nitrogen atoms, and/or nitrogen plasma and oxygen radicals, oxygen atoms, and/or oxygen plasma. In some embodiments the second reactant comprises oxygen radicals, oxygen atoms, and/or oxygen plasma. The second reactant may comprise other species that are not nitrogen or oxygen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments the second reactant may comprise a gas that acts as a carrier gas for the second reactant. In some embodiments a carrier gas that is used to form a plasma may flow constantly throughout the deposition process but only be activated intermittently. Additional phases may be added and phases may be removed as desired to adjust the composition of the final film.

One or more of the reactants may be provided with the aid of a carrier gas, such as Ar or He. In some embodiments the titanium precursor and the second reactant are provided with the aid of a carrier gas. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

In some embodiments the substrate is contacted with a first reactant and the substrate is moved such that it is contacted with a second reactant. In some embodiments the substrate can be moved within a single reaction space. In some embodiments the substrate can be moved from a first reaction space to a second, different reaction space.

As discussed in more detail below, in some embodiments for depositing a $TiO_xC_y$ film, one or more deposition cycles begin with contacting the substrate surface with the titanium precursor, followed by the second reactant. In other embodiments deposition may begin with contacting the surface with the second reactant, followed by the titanium precursor.

In some embodiments, if necessary, the exposed surfaces of the substrate or workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are typically removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films. In some other embodiments the reaction chamber is purged by stopping the flow of a precursor or reactant and continuing to flow carrier gas into the chamber. In some embodiments excess reactant and reaction byproducts are removed from the vicinity of the substrate by moving the substrate. In some embodiments the substrate is moved within a reaction chamber. In some embodiments the substrate is moved from a first reaction chamber to a second, different reaction chamber.

As mentioned above, in some embodiments a carrier gas is provided to the reaction chamber continuously during each deposition cycle, or during the entire ALD process, and reactive species are provided. Reactive species may be provided by generating a plasma in the gas, either in the reaction chamber or upstream of the reaction chamber, and may also be provided by injection into the carrier gas. In some embodiments the carrier gas may comprise helium, or argon. In some embodiments the carrier gas may also serve as a purge gas for the first and/or second reactant (or reactive species). In some embodiments the purge gas may be a reactant, for example, flowing the second reactant may serve as a purge gas for a first titanium precursor and also serve as reactive species when a plasma is formed in the gas. In some embodiments, nitrogen, argon, or helium may serve as a purge gas for a first precursor and a source of excited species for converting the titanium precursor into the $TiO_xC_y$ film.

The ALD cycle is repeated until a film of the desired thickness and composition is obtained. In some embodiments the deposition parameters, such as the flow rate, flow time, contact time, purge time, removal time, RF Power, RF on time and/or precursors themselves, may be varied in one or more deposition cycles during the ALD process in order to obtain a film with the desired characteristics.

The term "pulse" may be understood to comprise feeding reactant into the reaction chamber for a predetermined amount of time. The term "pulse" does not restrict the length or duration of the pulse and a pulse can be any length of time.

In some embodiments, the titanium precursor contacts the substrate first. After an initial surface termination, if necessary or desired, the substrate is contacted with a titanium precursor. In accordance with some embodiments, the titanium precursor contacts the substrate via a first titanium precursor pulse comprising a carrier gas flow and a volatile titanium species, such as TDMAT, that is reactive with the substrate surfaces of interest. Accordingly, the titanium precursor adsorbs upon these substrate surfaces. The first precursor self-saturates the substrate surfaces such that any excess constituents of the first precursor pulse do not further react with the molecular layer formed by this process.

The titanium precursor preferably contacts the substrate in gaseous form. The titanium precursor gas is considered "volatile" for purposes of the present description if the species exhibits sufficient vapor pressure under the process conditions to transport the species to the substrate in sufficient concentration to saturate exposed surfaces. In some embodiments the titanium precursor contacts the substrate by injecting the titanium precursor into the carrier gas. In some other embodiments the titanium precursor contacts the substrate separately from any carrier gas or inert gas flow.

In some embodiments the titanium precursor contact duration is from about 0.1 to 1.0 seconds. Conditions are preferably selected such that no more than about one monolayer of the titanium precursor is adsorbed on the substrate surface in a self-limiting manner. In some embodiments the appropriate titanium precursor contact duration can be longer or shorter depending on the particular circumstances. The appropriate contact duration can be readily determined by the skilled artisan based on the particular circumstances.

After sufficient time for a molecular layer to adsorb on the substrate surface, excess titanium precursor is then removed from the substrate surface. In some embodiments the excess titanium precursor is removed by stopping the flow of the titanium precursor while continuing to flow a carrier gas or purge gas for a sufficient time to diffuse or purge excess reactants and reactant by-products, if any, from the reaction space. In some embodiments the excess titanium precursor is removed with the aid of an inert gas that is flowing throughout the ALD cycle. In some embodiments the titanium precursor is removed by stopping the flow of the titanium precursor and starting to flow a carrier gas or purge gas. In some embodiments the titanium precursor is removed from the substrate surface by moving the substrate within a reaction chamber. In some embodiments the titanium precursor is removed from the substrate surface by moving the substrate from a first reaction chamber to a second, different reaction chamber.

In some embodiments the removal duration is from about 0.1 to about 1.0 seconds. In some embodiments the appropriate titanium precursor removal duration can be longer or shorter, depending on the particular circumstances. The appropriate removal duration can be readily determined by the skilled artisan based on the particular circumstances. In some embodiments the typical precursor purge duration is from about 0.1 to about 1.0 seconds.

In the second phase, a plurality of reactive species, such as a plasma comprising oxygen and nitrogen reactive species contact the surface of the substrate. A carrier gas may be flowed continuously to the reaction chamber during each ALD cycle in some embodiments. A plasma may be formed by generating a plasma in the second reactant in the reaction chamber or upstream of the reaction chamber, for example by flowing the second reactant through a remote plasma generator. In some embodiments, plasma is generated in the flowing second reactant. In some embodiments the second reactant is contacts the surface of the substrate before the plasma is ignited or nitrogen and oxygen atoms or radicals are formed. In some embodiments nitrogen atoms or radicals are not formed. In some embodiments the second reactant is introduced into the reaction chamber by injecting the second reactant into a carrier gas. In some other embodiments the second reactant contacts the surface of the substrate separately from any carrier gas or inert gas.

In some embodiments the second reactant contact duration is from about 0.1 to 1.0 seconds. In some embodiments the appropriate second reaction contact duration can be longer or shorter depending on the particular circumstances. The appropriate contact duration can be readily determined by the skilled artisan based on the particular circumstances.

In some embodiments the substrate may be contacted with the second reactant while the titanium precursor is still present at the substrate surface. In some embodiments the second reactant may contact the substrate prior to the removal of the titanium precursor from the surface of the substrate. In some embodiments the substrate may be contacted with the titanium precursor while the second reactant is still present at the substrate surface. In some embodiments the titanium precursor may contact the substrate prior to the removal of the second reactant from the surface of the substrate.

After a time period sufficient to completely saturate and react the previously adsorbed molecular layer with the plasma pulse, any excess reactant and reaction byproducts are removed from the substrate surface. As with the removal of the first reactant/precursor, in some embodiments this step may comprise stopping the generation of reactive species in the second reactant and continuing to flow the carrier gas for a time period sufficient for excess reactive species and volatile reaction by-products to diffuse out of and be purged from the reaction space. In some other embodiments removal may comprise stopping generating reactive species in the second reactant, stopping the flow of the second reactant, and continuing to flow the carrier gas. In other embodiments the generation of reactive species in the second reactant is stopped and a separate purge gas may be used. In some embodiments the generation of reactive species in the second reactant is stopped, the flow of second reactant into the reaction chamber is stopped, and separate purge gas may be used. In some embodiments the substrate is moved such that the second reactant/precursor no longer contacts the substrate. In some embodiments the substrate is moved within a reaction chamber. In some embodiments the substrate is moved from a first reaction chamber to a second, different reaction chamber. Together, the second reactant plasma provision and removal represent a second phase in a titanium oxycarbide atomic layer deposition cycle.

In some embodiments the removal duration is from about 0.1 to about 1.0 seconds. In some embodiments the appropriate second precursor removal duration can be longer or shorter, depending on the particular circumstances. The appropriate removal duration can be readily determined by the skilled artisan based on the particular circumstances. A plasma may be generated by applying RF power to the second reactant. The RF power may be applied to second reactant that flows during the second reactant plasma pulse time, that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 100 W to about 1000 W, preferably from about 200 W to about 500 W. In some embodiments the RF power applied to the second reactant is about 400 W.

The two phases together represent one ALD cycle, which is repeated to form $TiO_xC_y$ thin films of a desired thickness. While the ALD cycle is generally referred to herein as beginning with the titanium precursor phase, it is contemplated that in other embodiments the cycle may begin with the second reactant phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the titanium phase.

Additional phases may be added and phases may be removed as desired to adjust the composition of the final film. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

According to some embodiments of the present disclosure, PEALD reactions may be performed at temperatures ranging from about 30° C. to about 250° C., preferably from about 70° C. to about 200° C. In some embodiments the PEALD reactions may be performed at pressures ranging from about 150 Pa to about 800 Pa, preferably from about 200 Pa to about 400 Pa. In some embodiments the PEALD reactions may be performed at about 400 Pa.

In some embodiments a titanium oxycarbide plasma enhanced ALD deposition cycle that can be used to deposit a titanium oxycarbide thin film in accordance with some embodiments on the invention. According to certain embodiments, a titanium oxycarbide thin film is formed on a substrate by an ALD-type process comprising at least one titanium oxycarbide deposition cycle, the titanium oxycarbide deposition cycle comprising:

(1) contacting a substrate with a titanium reactant such that the titanium compound adsorbs on the substrate surface;

(2) removing excess titanium precursor and any byproducts from the substrate surface;

(3) contacting the substrate with a second reactant comprising at least one reactive species generated by plasma, the at least one reactive species comprising oxygen; and (4) removing excess second reactant and reaction byproducts from the substrate surface.

The contacting and removing steps are repeated until a thin film of a desired thickness and composition is obtained.

As discussed above, the second reactant in a PEALD process used to form $TiO_xC_y$ according to the present disclosure may comprise a nitrogen precursor and an oxygen precursor, which may comprise plasma generated from oxygen and nitrogen precursors. In some embodiments the second reactant in a PEALD process used to form $TiO_xC_y$ according to the present disclosure may comprise an oxygen precursor, which may comprise plasma generated from an oxygen precursor. In some embodiments the second reactant may not comprise a nitrogen precursor. Suitable plasma compositions include nitrogen plasma, radicals of nitrogen, or atomic nitrogen, and oxygen plasma, radicals of oxygen, or atomic oxygen in one form or another. In some embodiments a plasma may not contain nitrogen. In some embodiments a plasma may also contain hydrogen, such as hydrogen plasma, radicals of hydrogen, or atomic hydrogen in one form or another. And in some embodiments, a plasma may also contain noble gases, such as He, Ne, Ar, Kr and Xe, preferably Ar or He, in plasma form, as radicals, or in atomic form. In some embodiments, the second reactant does not comprise any species from a noble gas, such as Ar. Thus, in some embodiments plasma is not generated in a gas comprising a noble gas.

In some embodiments the second reactant may be formed at least in part, from an N-containing compound and an O-containing compound, where the N-containing compound and O-containing compound are provided at a ratio (N-containing compound/O-containing compound) from about 1:1 to about 100:1, preferably about 19:1. In some embodiments the second reactant may comprise plasma formed from both compounds having N and compounds having O, such as a mixture of $N_2$ and $O_2$. In some embodiments the second reactant may be formed at least in part, from $N_2$ and $O_2$, where the $N_2$ and $O_2$ are provided at a ratio ($N_2/O_2$) from about 1:1 to about 100:1, preferably about 19:1. In some embodiments the second reactant may comprise plasma formed from compounds having 0 and not from compounds having N, such as $O_2$.

In some embodiments the second reactant may comprise plasma formed from both compounds having N and compounds having O. In some embodiments the second reactant may not comprise plasma formed from compounds having N. Where the second reactant comprises a compound having N, the compound having N may be selected from one of $N_2$, $NH_3$, and $N_2H_2$. The compounds having O may be selected from at least one of $O_3$, $N_2O$, $CO_2$, $CO$, $H_2O$, and $H_2O_2$.

The second reactant may be formed in some embodiments remotely via plasma discharge ("remote plasma") away from the substrate or reaction space. In some embodiments, the second reactant may be formed in the vicinity of the substrate or directly above substrate ("direct plasma").

In some embodiments the second reactant may be provided into a reaction chamber In some embodiments a suitable second reactant can include compounds having nitrogen, compounds having O, and an inert carrier gas. Various reactant flow rates can be suitable. In some embodiments the second reactant may comprise N2, O2, and Ar. In some embodiments a flow rate for N2 is from about 0 slm to about 10 slm. In some embodiments a flow rate for O2 is from about 0.001 slm to about 10 slm. In some embodiments a flow rate for Ar is from about 0 slm to about 10 slm.

Titanium Carbide Deposition

Methods for depositing titanium carbide films by ALD are known in the art and can be utilized in forming the titanium nanolaminates described herein. In some embodiments a titanium carbide film is formed by alternately and sequentially contacting a substrate with a first titanium precursor and a second reactant. One or both reactants can be provided with the aid of a carrier gas. In some embodiments, excess reactants and reaction byproducts are removed from the reaction space, for example with the aid of an inert purge gas.

In some embodiments, plasma enhanced ALD (PEALD) processes are used to deposit titanium carbide films. In some embodiments, thin titanium carbide films are formed by repetition of an ALD cycle. Preferably, for forming titanium carbide films, each ALD cycle comprises at least two distinct phases. The contacting and removal of a reactant from the substrate surface may be considered a phase. In a first phase, a first reactant comprising titanium contacts the substrate surface and conformally forms no more than about one monolayer on the substrate. This reactant is also referred to herein as "the titanium precursor," "titanium-containing precursor," or "titanium reactant" and may be, for example, titanium tetraisopropoxide (TTIP), tetrakis(dimethylamino) titanium (TDMAT), tetrakis(diethylamino)titanium (TDEAT), tetrakis(ethylmetylamino)titanium (TEMAT).

In a second phase, a second reactant comprising a reactive species or multiple reactive species contacts the substrate surface and may convert adsorbed titanium to titanium carbide. In some embodiments, the reactive species comprises one or more excited species. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments the second reactant may comprise a gas that acts as a carrier gas for the second reactant. In some embodiments a carrier gas that is used to form a plasma may flow constantly throughout the deposition process but only be activated intermittently. Additional phases may be added and phases may be removed as desired to adjust the composition of the final film.

One or more of the reactants may be provided with the aid of a carrier gas, such as Ar or He. In some embodiments the titanium precursor and the second reactant are provided with the aid of a carrier gas. In some embodiments, two of the phases may overlap, or be combined. For example, the titanium precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

In some embodiments a titanium carbide thin film is formed on a substrate surface by an ALD type process comprising at least one titanium carbide deposition cycles, the deposition cycle comprising:

contacting the substrate surface with a first vapor phase reactant comprising a first titanium precursor into the reaction chamber to form a layer of the titanium precursor on the substrate; and contacting the substrate with a second vapor phase reactant such that the second reactant reacts with the first Ti precursor on the substrate in a self-limiting manner to form titanium carbide.

In some embodiments excess first reactant is removed from the reaction chamber after contacting the substrate with the first reactant and prior to contacting the substrate with the second reactant. In some embodiments excess second reactant and reaction byproducts, if any, are removed from the reaction chamber after contacting the substrate with the second vapor phase reactant and prior to any further processing.

This can be referred to as a titanium carbide deposition cycle. Each titanium carbide deposition cycle typically forms at most about one monolayer of titanium carbide selectively on the substrate surface. In some cases where the deposition temperature is above the decomposition temperature of the titanium precursor, more than one monolayer of titanium carbide can be formed in each titanium carbide deposition cycle. The titanium carbide deposition cycle is repeated until a layer of the nanolaminate of a desired thickness is formed.

Although the illustrated titanium carbide deposition cycle begins with provision of the first titanium precursor, in other embodiments the deposition cycle begins with the provision of the second reactant. It will be understood by the skilled artisan that provision of the first titanium precursor and second reactant are interchangeable in the ALD cycle.

In some embodiments, the reactants and reaction byproducts can be removed from the reaction chamber by stopping the flow of reactant while continuing the flow of an inert carrier gas such as nitrogen or argon.

In some embodiments, the ALD process may be a plasma ALD (PEALD) process. In some embodiments the process may be a thermal ALD process.

As mentioned above, in some embodiments one or more titanium carbide layers in a titanium nanolaminate may be deposited by a CVD process, such as a pulsed CVD process, in which a Ti precursor and a second reactant are provided to the reaction chamber.

Exemplary second reactants that may be used include, but are not limited to hydrogen, hydrogen plasma, hydrogen radicals or hydrogen atoms.

In some embodiments, multiple ALD cycles can be used to deposit a titanium carbide layer to a desired thickness in a nanolaminate. For example, in some embodiments about 1 to about 1000 ALD deposition cycles are performed. The skilled artisan will appreciate that the number of cycles can be selected based on the desired thickness of the layer in the nanolaminate.

In some embodiments the titanium precursor contact duration is from about 0.1 to 1.0 seconds, preferably about 0.4 seconds. Conditions are preferably selected such that no more than about one monolayer of the titanium precursor is adsorbed on the substrate surface in a self-limiting manner. In some embodiments the appropriate titanium precursor contact duration can be longer or shorter depending on the particular circumstances. The appropriate contact duration can be readily determined by the skilled artisan based on the particular circumstances.

In some embodiments the removal duration is from about 0.1 to about 1.0 seconds. In some embodiments the appropriate titanium precursor removal duration can be longer or shorter, depending on the particular circumstances. The appropriate removal duration can be readily determined by the skilled artisan based on the particular circumstances. The typical precursor purge duration is also from about 0.1 to about 1.0 seconds. This is also depends on each condition.

In some embodiments the second reactant contact duration is from about 0.1 to 1.0 seconds, preferably about 0.2 seconds. In some embodiments the appropriate second reaction contact duration can be longer or shorter depending on the particular circumstances. The appropriate contact duration can be readily determined by the skilled artisan based on the particular circumstances.

In some embodiments the removal duration is from about 0.1 to about 1.0 seconds. In some embodiments the appropriate second precursor removal duration can be longer or shorter, depending on the particular circumstances. The appropriate removal duration can be readily determined by the skilled artisan based on the particular circumstances.

A plasma may be generated by applying RF power to the second reactant. The RF power may be applied to second reactant that flows during the second reactant plasma pulse time, that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 100 W to about 1000 W, preferably from about 200 W to about 500 W.

According to some embodiments of the present disclosure, PEALD reactions may be performed at temperatures ranging from about 20° C. to about 500° C., preferably from about 70° C. to about 200° C. In some embodiments the PEALD reactions may be performed at pressures ranging from about 50 Pa to about 1000 Pa, preferably from about 200 Pa to about 400 Pa.

Titanium Precursors

A number of suitable titanium precursors can be used in the presently disclosed processes for forming titanium nanolaminate thin films. In some embodiments the titanium precursor comprises an organometallic precursor. In some embodiments the titanium precursor is tetravalent (that is, Ti has an oxidation state of +IV). In some embodiments the titanium precursor comprises at least one alkylamine ligand. In some embodiments the titanium precursor comprises at least one halide ligand. In some embodiments the titanium precursor does not comprise a halide ligand. In some embodiments the titanium precursor does not comprise four halide ligands. In some embodiments the titanium precursor may comprise at least one amine or alkylamine ligand, $-NR^{I}R^{II}$, wherein $R^{I}$ and $R^{II}$ can be independently chosen from alkyl ligands, preferably ethyl or methyl. In some embodiments the titanium precursor may comprise at least one alkoxide ligand. In some embodiments the titanium precursor may comprise a heteroleptic compound. In some embodiments the titanium precursor comprises tetrakis(dialkylamino)titanium compounds $Ti(NR^{I}R^{II})_4$, such as tetrakis(dimethylamino)titanium (TDMAT) $Ti(NMe_2)_4$.

In some embodiments the titanium precursor comprises a halide ligand. In some embodiments the titanium precursor comprises at least one of $TiCl_4$, $TiF_4$, $TiI_4$, $TiBr_4$. In some cases halide ligands may, at certain process parameter, such as at high temperatures promote crystallization and promote roughness or reduce smoothness. However, in some embodiments halide ligands may be used, especially in combination with second reactants comprising nitrogen.

In some embodiments the titanium precursor comprises at least one alkyl or substituted alkyl ligand. In some embodiments the titanium precursor comprises an alkoxide. In some embodiments the titanium precursor comprises at least one of titanium methoxide $Ti(OMe)_4$, titanium ethoxide $Ti(OEt)_4$, and titanium isopropoxide ($Ti(O^{i}Pr)_4$ or TTiP).

In some embodiments the titanium precursor comprises at least one amine or alkylamine ligand. In some embodiments the titanium precursor comprises at least one of $Ti(NMeEt)_4$ (TEMAT), $Ti(N(Et)_2)_4$ (TDEAT), and $Ti(N(Me)_2)_4$ (TDMAT).

In some embodiments the titanium precursor comprises a heteroleptic precursor. In some embodiments the titanium precursor comprises at least one of $Ti(O^{i}Pr)_2(dmae)_2$, $Ti(Me_5Cp)(OMe)_3$, $Ti(MeCp)(OMe)_3$, $TiCp(NMe_2)_3$, $Ti(Me_5Cp)(NMe_2)_3$, $Ti(mpd)(thd)_2$, and $Ti(O^{i}Pr)_2(thd)_2$. In some embodiments the titanium precursor comprises cyclic ligands, such as a cyclopentadienyl or derivative of a cyclopentadienyl ligand. In some embodiments the titanium precursor has at least one Ti—N bond. In some embodiments the titanium precursor has at least one —Ti—N—C— bond structure.

In some embodiments the titanium precursor comprises at least one of titanium tetraisopropoxide (TTiP), tetrakis(dimethylamino)titanium (TDMAT), tetrakis(diethylamino)titanium (TDEAT), and tetrakis(ethylmetylamino)titanium (TEMAT).

In some embodiments more than one titanium precursor may contact the substrate surface at the same time during an ALD phase. In some embodiments the titanium precursor may comprises more than one titanium reactant. In some embodiments a first titanium precursor is used in a first deposition cycle and a second, different titanium precursor is used in a later deposition cycle. In some embodiments multiple titanium precursors may be used during a single deposition phase, for example, in order to optimize certain properties of the deposited layer of the titanium nanolaminate film.

Integrated Circuit Fabrication Processes

The processes described herein can be used to form titanium nanolaminate films for use, for example, in integrated circuit fabrication. A titanium nanolaminate film may be used as, for example, a sacrificial film in pattering applications or may be used as spacers, for example for use in pitch multiplication processes.

By way of example, in a pitch multiplication process a titanium nanolaminate is conformally deposited via ALD in a reaction space on a substrate comprising an existing mask feature. The conformal, smooth, and substantially amorphous titanium nanolaminate film can then be directionally etched so that the nanolaminate is removed from the horizontal surfaces of the mask feature and substrate, leaving only the titanium nanolaminate deposited on or extending from the sidewalls of the mask feature. The mask feature can then be removed via an etching process, leaving behind the pitch doubled titanium nanolaminate spacers.

In some embodiments the titanium nanolaminate thin film is substantially amorphous when grown thicker than 20 nm. As a consequence of remaining substantially amorphous, the titanium nanolaminate thin film is smooth enough for use in a variety of contexts, for examples as a spacer or sacrificial film. In preferred embodiments of the invention a titanium nanolaminate thin film is grown that is substantially free of crystallites. In some embodiments the titanium nanolaminate thin film is substantially less crystalline than a pure $TiO_2$ thin film grown at the same deposition conditions. In some embodiments of the invention the titanium nanolaminate thin film has etch selectivity towards $SiO_2$; that is, an etchant will preferentially etch $SiO_2$ as compared to the titanium nanolaminate film. In preferred embodiments of the invention, the titanium nanolaminate film has a substantially similar etch selectivity towards $SiO_2$ as pure $TiO_2$.

In some embodiments of the present invention the substrate comprises a thermal $SiO_2$ layer on a silicon substrate. The substrate may comprise at least one mask feature, such as a three-dimensional raised feature. In some embodiments the mask feature comprises an elevated structure that includes substantially vertical sidewalls. In some embodiments the mask feature is photolithographically formed by transferring a pattern formed in a photoresist layer to a $SiO_2$ layer on a silicon substrate.

In preferred embodiments of the invention the titanium nanolaminate film is conformally deposited on a three dimensional structure, such as a mask feature, or features, and substrate.

After a smooth, substantially amorphous titanium nanolaminate thin film has been conformally deposited over a mask feature on a substrate, the nanolaminate thin film is directionally etched. In some embodiments the directional etch preferentially etches the nanolaminate thin film from the horizontal surfaces of the mask feature and substrate while leaving the nanolaminate film deposited on the vertical surfaces or sidewalls of the mask feature relatively unetched. In preferred embodiments the directional etch is a reactive ion etch. In preferred embodiments the directional etching removes substantially all of the titanium nanolaminate thin film from the horizontal surfaces of the mask feature and substrate while leaving the spacers, or the titanium nanolaminate deposited on, or extending from the sidewalls, or vertical surfaces of the mask feature substantially unetched.

The mask feature can then be removed with a preferential etch, thereby leaving the free-standing spacers on the substrate. In some embodiments the preferential etch is a wet etch. In preferred embodiments the preferential etch is a wet hydrofluoric acid etch. In preferred embodiments of the invention the titanium nanolaminate spacers have etch selectivity characteristics such that the preferential etch removes substantially all of the mask feature, while leaving the spacers relatively unetched. In preferred embodiments the spacers have etch selectivity characteristics substantially similar to those of pure $TiO_2$.

Once the mask feature has been preferentially etched, the spacers remain on the substrate. The titanium nanolaminate which had been deposited on, or extended from the vertical surfaces of the mask feature now comprises the spacers. Whereas before there had been one feature, the mask feature, and one space, there are now two features, the spacers, and two spaces. Therefore the spacer deposition process has doubled the linear density of features on the substrate, or doubled the pitch.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

The term "titanium oxide" as used herein is meant to refer primarily to titanium monoxide (TiO), titanium dioxide ($TiO_2$), and/or a combination of those or other oxides of titanium, although in some cases, as will be clear to those of ordinary skill in the art the term may also refer to dititanium trioxide ($Ti_2O_3$), $Ti_2O$, $Ti_3O$, oxides having the formula $Ti_nO_{2n-1}$, or any combination of the same.

What is claimed is:

1. A process for depositing a titanium nanolaminate thin film in integrated circuit fabrication comprising:
   depositing a first titanium material layer comprising nitrogen, oxygen, and/or carbon by at least one cycle of a first deposition process;
   depositing a second titanium oxide layer by at least one cycle of a second deposition process, wherein the second titanium oxide layer is a different material from the first titanium material; and
   repeating at least the depositing a first titanium material layer step until a titanium nanolaminate thin film of a desired thickness has been formed, wherein the first titanium material comprises at least one of titanium oxynitride, titanium oxycarbide, titanium nitride, and titanium carbide, and wherein the titanium nanolaminate film comprises multiple alternating layers of the first titanium material layer and the second different titanium oxide layer.

2. The process of claim 1, wherein the process is used to form spacers in an integrated circuit fabrication process.

3. The process of claim 1, wherein the first titanium material layer comprises titanium nitride and the second titanium oxide layer comprises titanium oxide.

4. The process of claim 1, wherein a number of cycles of the first titanium material deposition process is more than about 2 times a number of cycles of the second titanium oxide deposition process.

5. The process of claim 1, wherein a cycle of the second titanium oxide deposition process is carried out for between about every 1 cycle to about every 100 cycles of the first titanium material deposition process.

6. The process of claim 1, wherein a ratio of a number of first titanium material layers to a number of second titanium oxide layers in the titanium nanolaminate thin film is from about 1:1 to about 100:1.

7. The process of claim 1, wherein a ratio of a number of first titanium material layers to a number of second titanium oxide layers in the titanium nanolaminate thin film is from about 1:1 to about 30:1.

8. The process of claim 1, wherein at least one of the first cyclical deposition process and the second cyclical deposition process is a plasma enhanced atomic layer deposition (PEALD) process.

9. The process of claim 1, wherein the first cyclical deposition process comprises at least one cycle, the cycle comprising:
   contacting the substrate with a first vapor phase titanium precursor;
   removing excess first vapor phase titanium precursor and reaction by-products, if any;
   contacting the substrate with a first vapor phase reactant;
   removing excess first vapor phase reactant and reaction by-products, if any;
   repeating the contacting and removing steps until a first titanium material layer comprising nitrogen, oxygen, and/or carbon of a desired thickness is formed.

10. The process of claim 9, wherein the first vapor phase titanium precursor comprises an alkylamine ligand.

11. The process of claim 9, wherein the first vapor phase titanium precursor comprises at least one of titanium tetraisopropoxide (TTiP), tetrakis(dimethylamino)titanium (TDMAT), tetrakis(diethylamino)titanium (TDEAT), and tetrakis(ethylmetylamino)titanium (TEMAT).

12. The process of claim 9, wherein the first vapor phase reactant comprises at least one of $NH_3$, $N_2H_2$, nitrogen plasma, nitrogen radicals, nitrogen atoms, $O_2$, $O_3$, $H_2O$, oxygen plasma, oxygen radicals, oxygen atoms, $H_2$, hydrogen plasma, hydrogen radicals, and hydrogen atoms.

13. The process of claim 1, wherein the second cyclical deposition process comprises at least one cycle, the cycle comprising:
   contacting the substrate with a second vapor phase titanium precursor;
   removing excess second vapor phase titanium precursor and reaction by-products, if any;
   contacting the substrate with a second vapor phase reactant comprising oxygen;
   removing excess second vapor phase reactant and reaction by-products, if any;
   repeating the contacting and removing steps until a second titanium oxide layer of a desired thickness is formed.

14. The process of claim 13, wherein the second vapor phase titanium precursor comprises an alkylamine ligand.

15. The process of claim 13, wherein the second vapor phase titanium precursor comprises at least one of titanium tetraisopropoxide (TTiP), tetrakis(dimethylamino)titanium (TDMAT), tetrakis(diethylamino)titanium (TDEAT), and tetrakis(ethylmetylamino)titanium (TEMAT).

16. The process of claim 13, wherein the second vapor phase reactant comprises at least one of $O_2$, $O_3$, $H_2O$, oxygen plasma, oxygen radicals, oxygen atoms.

17. The process of claim 1, wherein the first vapor phase titanium precursor and the second vapor phase titanium precursor are the same.

18. The process of claim 1, wherein a ratio of an etch rate of the titanium nanolaminate thin film to an etch rate of silicon dioxide is from about 1:10 to about 1:3.

19. The process of claim 1, wherein the titanium nanolaminate has a surface roughness, Rq, less than about 0.2 microns.

20. A process for depositing a titanium nanolaminate thin film on a substrate in a reaction chamber by an atomic layer deposition (ALD) process comprising at least one supercycle, the supercycle comprising:
   a first titanium material deposition process comprising at least one cycle, the cycle comprising:
      alternately and sequentially contacting the substrate with a first vapor phase titanium precursor and a first reactant; and
   a second titanium oxide layer deposition process comprising at least one cycle, the cycle comprising:
      alternately and sequentially contacting the substrate with a second vapor phase titanium precursor and a second reactant comprising oxygen;
      wherein the second titanium oxide is a different material from the first titanium material; and
   repeating at least the first titanium material deposition process until a titanium nanolaminate thin film of a desired thickness is formed, wherein the titanium nanolaminate film comprises multiple alternating layers of the first titanium material and the second different titanium material.

21. The process of claim 20, wherein the process is used to form spacers for use in integrated circuit fabrication.

22. The process of claim 20, wherein the first vapor phase titanium precursor and the second vapor phase titanium precursor comprise at least one of titanium tetraisopropoxide (TTiP), tetrakis(dimethylamino)titanium (TDMAT), tetrakis(diethylamino)titanium (TDEAT), and tetrakis(ethylmetylamino)titanium (TEMAT).

23. The process of claim 20, wherein the first reactant comprises at least one of $NH_3$, $N_2H_2$, nitrogen plasma, nitrogen radicals, nitrogen atoms, $O_2$, $O_3$, $H_2O$, oxygen plasma, oxygen radicals, oxygen atoms, $H_2$, hydrogen plasma, hydrogen radicals, and hydrogen atoms.

24. The process of claim 20, wherein the second reactant comprises at least one of $O_2$, $O_3$, $H_2O$, oxygen plasma, oxygen radicals, oxygen atoms.

25. The process of claim 20, wherein a number of first titanium material deposition cycles is more than about 2 times a number of second titanium oxide deposition cycles.

* * * * *

UNITED STATES PATENT AND TRADEMARK OFFICE
CERTIFICATE OF CORRECTION

PATENT NO. : 9,540,729 B1
APPLICATION NO. : 14/835456
DATED : January 10, 2017
INVENTOR(S) : Seiji Okura et al.

It is certified that error appears in the above-identified patent and that said Letters Patent is hereby corrected as shown below:

On the Title Page

In Column 2 (page 2, item (56)) at Line 2, Under Other Publications, change "Axample" to --Example--.

In Column 2 (page 2, item (56)) at Line 56, Under Other Publications, change "$TiO_2\text{---}_xH_2O$" to --$TiO_{2-x}H_2O$--.

In Column 1 (page 4, item (56)) at Line 19, Under Other Publications, change "$RuO_2Gate$" to --$RuO_2$ Gate--.

In the Specification

In Column 3 at Line 41, Change "ethylmetylamino" to --ethylmethylamino--.

In Column 4 at Line 1, Change "ethylmetylamino" to --ethylmethylamino--.

In Column 4 at Line 49, Change "ethylmetylamino" to --ethylmethylamino--.

In Column 14 at Line 55, Change "ethylmetylamino" to --ethylmethylamino--.

In Column 17 at Lines 30-31, Change "ethylmetylamino" to --ethylmethylamino--.

In Column 17 at Line 35, Before "a" delete "an".

In Column 20 at Lines 9-10, Change "ethylmetylamino" to --ethylmethylamino--.

In Column 30 at Line 39, Change "0" to --O--.

Signed and Sealed this
Eighteenth Day of April, 2017

Michelle K. Lee
*Director of the United States Patent and Trademark Office*

CERTIFICATE OF CORRECTION (continued)
U.S. Pat. No. 9,540,729 B1

In Column 31 at Line 23, Change "ethylmetylamino" to --ethylmethylamino--.

In Column 34 at Line 23, Change "ethylmetylamino" to --ethylmethylamino--.

In the Claims

In Column 36 at Line 67, In Claim 11, change "ethylmetylamino" to --ethylmethylamino--.

In Column 37 at Line 26 (approx.), In Claim 15, change "ethylmetylamino" to --ethylmethylamino--.

In Column 38 at Lines 27-28 (approx.), In Claim 22, change "ethylmetylamino" to --ethylmethylamino--.